(12) United States Patent
Goto et al.

(10) Patent No.: US 10,566,367 B2
(45) Date of Patent: Feb. 18, 2020

(54) SEMICONDUCTOR DEVICE AND A MANUFACTURING METHOD THEREOF

(71) Applicant: Renesas Electronics Corporation, Tokyo (JP)

(72) Inventors: Yotaro Goto, Hitachinaka (JP); Takeshi Kamino, Hitachinaka (JP); Fumitoshi Takahashi, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/900,383

(22) Filed: Feb. 20, 2018

(65) Prior Publication Data
US 2018/0308884 A1    Oct. 25, 2018

(30) Foreign Application Priority Data
Apr. 24, 2017   (JP) .................... 2017-085425

(51) Int. Cl.
*H01L 27/146* (2006.01)

(52) U.S. Cl.
CPC ...... *H01L 27/1463* (2013.01); *H01L 27/1461* (2013.01); *H01L 27/1462* (2013.01); *H01L 27/1464* (2013.01); *H01L 27/14603* (2013.01); *H01L 27/14645* (2013.01); *H01L 27/14685* (2013.01); *H01L 27/14689* (2013.01)

(58) Field of Classification Search
USPC ......................................................... 257/292
See application file for complete search history.

(56) References Cited

U.S. PATENT DOCUMENTS 9,755,094 B2    9/2017    Sakai et al.

FOREIGN PATENT DOCUMENTS

JP        2016-111082 A    6/2016

*Primary Examiner* — Hrayr A Sayadian
(74) *Attorney, Agent, or Firm* — McDermott Will & Emery LLP

(57) ABSTRACT

The performances of a semiconductor device are improved. A semiconductor device has a transfer transistor and a photodiode. The photodiode has an n type semiconductor region, an n⁺ type semiconductor region, and a second p type semiconductor region surrounded by a first p type semiconductor region of an interpixel isolation region. The n⁺ type semiconductor region is formed on the main surface side of the semiconductor substrate, and the n type semiconductor region is formed under the n⁺ type semiconductor region via the second p type semiconductor region. In the channel length direction of the transfer transistor, in the n type semiconductor region, an n⁻⁻ type semiconductor region having a lower impurity density than that of the n type semiconductor region is arranged, to improve the transfer efficiency of electric charges accumulated in the photodiode.

7 Claims, 27 Drawing Sheets

SEMICONDUCTOR DEVICE AND A MANUFACTURING METHOD THEREOF

CROSS-REFERENCE TO RELATED APPLICATIONS

The disclosure of Japanese Patent Application No. 2017-085425 filed on Apr. 24, 2017 including the specification, drawings and abstract is incorporated herein by reference in its entirety.

BACKGROUND

The present invention relates to a semiconductor device and a manufacturing method thereof, and is preferably applicable to a semiconductor device including, for example, a solid-state image sensing element, and a manufacturing method thereof.

As a solid-state image sensing element (which may also be referred to simply as an image sensing element) for use in a digital camera, or the like, a CMOS image sensor using a CMOS (Complementary Metal Oxide Semiconductor) has been under development. The CMOS image sensor includes a plurality of pixels arranged in a matrix, and each for detecting a light. Further, in the inside of each of the plurality of pixels, a photoelectric conversion element such as a photodiode for detecting a light, and generating electric charges is formed. The photodiode is a pn junction diode, and is formed of, for example, a plurality of n type or p type impurity regions, namely, semiconductor regions.

Japanese Unexamined Patent Application Publication No. 2016-111082 (Patent Document 1) discloses a structure in which a plurality of p type semiconductor regions and n type semiconductor regions are arranged alternately in a comb teeth shape in order to increase the capacitance (number of saturated electrons) of the photodiode.

CITED DOCUMENT

Patent Document

Patent Document 1 Japanese Unexamined Patent Application Publication No. 2016-111082

SUMMARY

As such a photodiode in a semiconductor device including a CMOS image sensor, the one can be considered in which an n type semiconductor region is formed deeply and widely in a p type semiconductor substrate (or a p type well). As a result, in a back-surface irradiation type image sensor, even when an incident light is made incident upon the portion near the back surface of the semiconductor substrate (the portion far distant from the main surface of the semiconductor substrate), it is possible to increase the efficiency of generation of electrons due to photoelectric conversion resulting from absorption of the incident light at the photodiode, a so-called internal quantum efficiency. Further, it is possible to increase the capacitance (number of saturated electrons) of the photodiode. However, the n type semiconductor region is formed deeply and widely in the p type semiconductor substrate. For this reason, the charge transfer efficiency cannot be increased, resulting in the degradation of the performances of the semiconductor device including a photoelectric conversion element.

Other objects and novel features will be apparent from the description of this specification and the accompanying drawings.

In accordance with one embodiment, a semiconductor device has a transfer transistor and a photodiode. The photodiode has an $n^-$ type semiconductor region, an $n^+$ type semiconductor region, and a p type semiconductor region surrounded by a p type semiconductor region of an interpixel isolation region. The $n^+$ type semiconductor region is formed on the main surface side of the semiconductor substrate, and the $n^-$ type semiconductor region is formed under the $n^+$ type semiconductor region via a p type semiconductor region. Then, in the channel length direction of the transfer transistor, an $n^{--}$ type semiconductor region is arranged in the $n^-$ type semiconductor region. The impurity density of the $n^{--}$ type semiconductor region is lower than the impurity density of the $n^-$ type semiconductor region.

In accordance with one embodiment, the performances of the semiconductor device can be improved.

DETAILED DESCRIPTION

Figure 1:
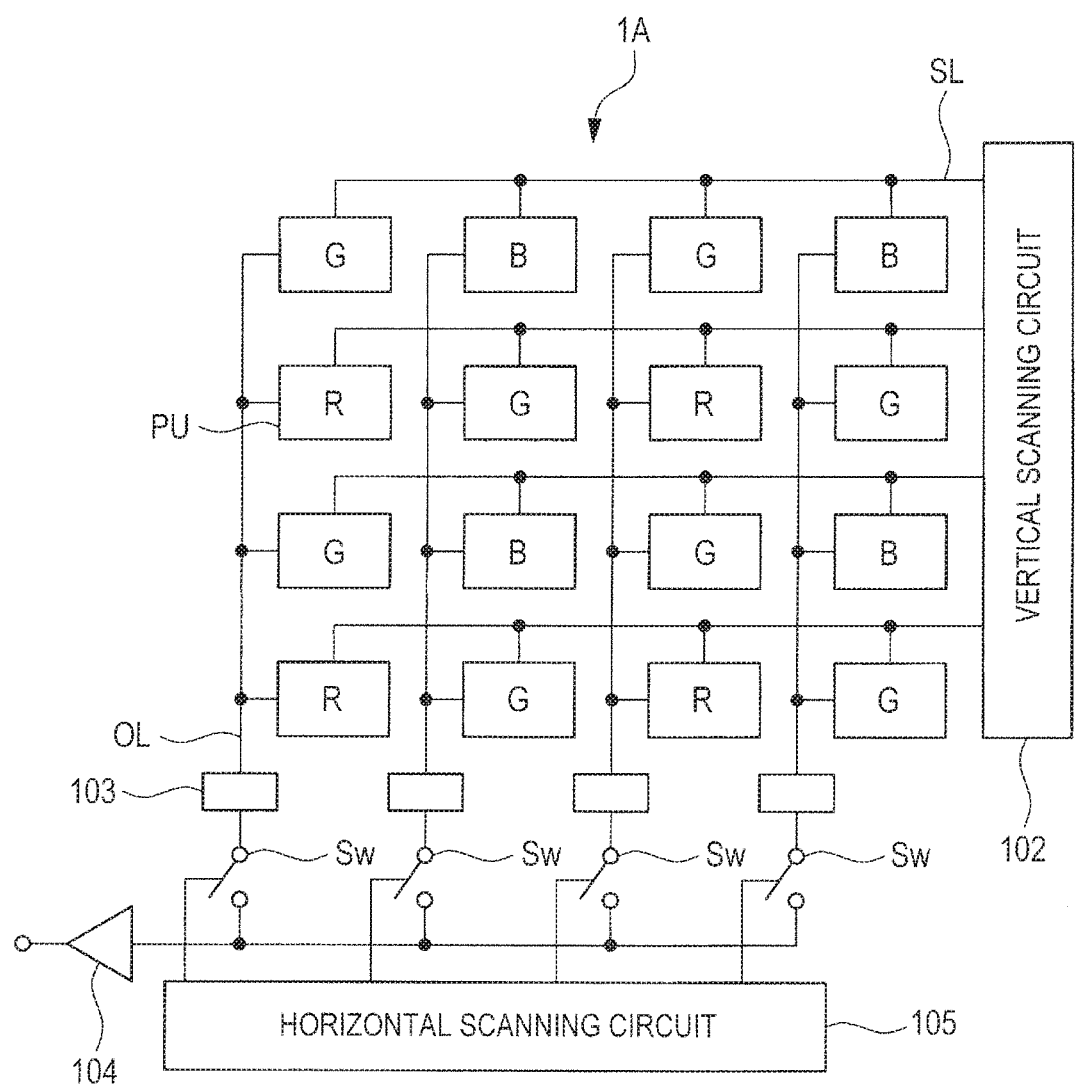
FIG. 1 is a circuit block diagram showing a configuration example of a semiconductor device of an embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of apart or the whole of the other.

Further, in the following embodiments, when a reference is made to the number of elements, and the like (including number, numerical value, quantity, range, or the like), the number of elements, or the like is not limited to a specific number, but may be greater than or less than the specific number, unless otherwise specified, except for the case where the number is apparently limited to the specific number in principle, or except for other cases.

Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, representative embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar parts will not be repeated in principle unless otherwise required.

Further, in the drawings for use in the embodiments, hatching may be omitted even in cross sectional view for ease of understanding of the drawing. Whereas, hatching may be added even in plan view for ease of understanding of the drawing.

Further, in a cross sectional view and a plan view, the dimensions of each part do not correspond to those of an actual device. For ease of understanding of the drawing, a specific part may be shown on a relatively enlarged scale. Whereas, also when a plan view and a cross sectional view correspond to each other, each part may be shown on a changed scale.

Further, the impurity density of the p type semiconductor region is the net impurity density obtained by subtracting the n type impurity density from the p type impurity density. The impurity density of the n type semiconductor region is the net impurity density obtained by subtracting the p type impurity density from the n type impurity density.

EMBODIMENTS

Below, the structure and the manufacturing steps of a semiconductor device of the present embodiment will be described in details by reference to the accompanying drawings. In the present embodiment, a description will be given to an example of a semiconductor device including a back-surface irradiation type CMOS image sensor.

The present embodiment relates to the improvement of the related technology of the prior application of the present applicant (Japanese Patent Application No. 2015-256599). Therefore, the related technology is a part of the present embodiment.

Description of Related Technology

Figure 26:
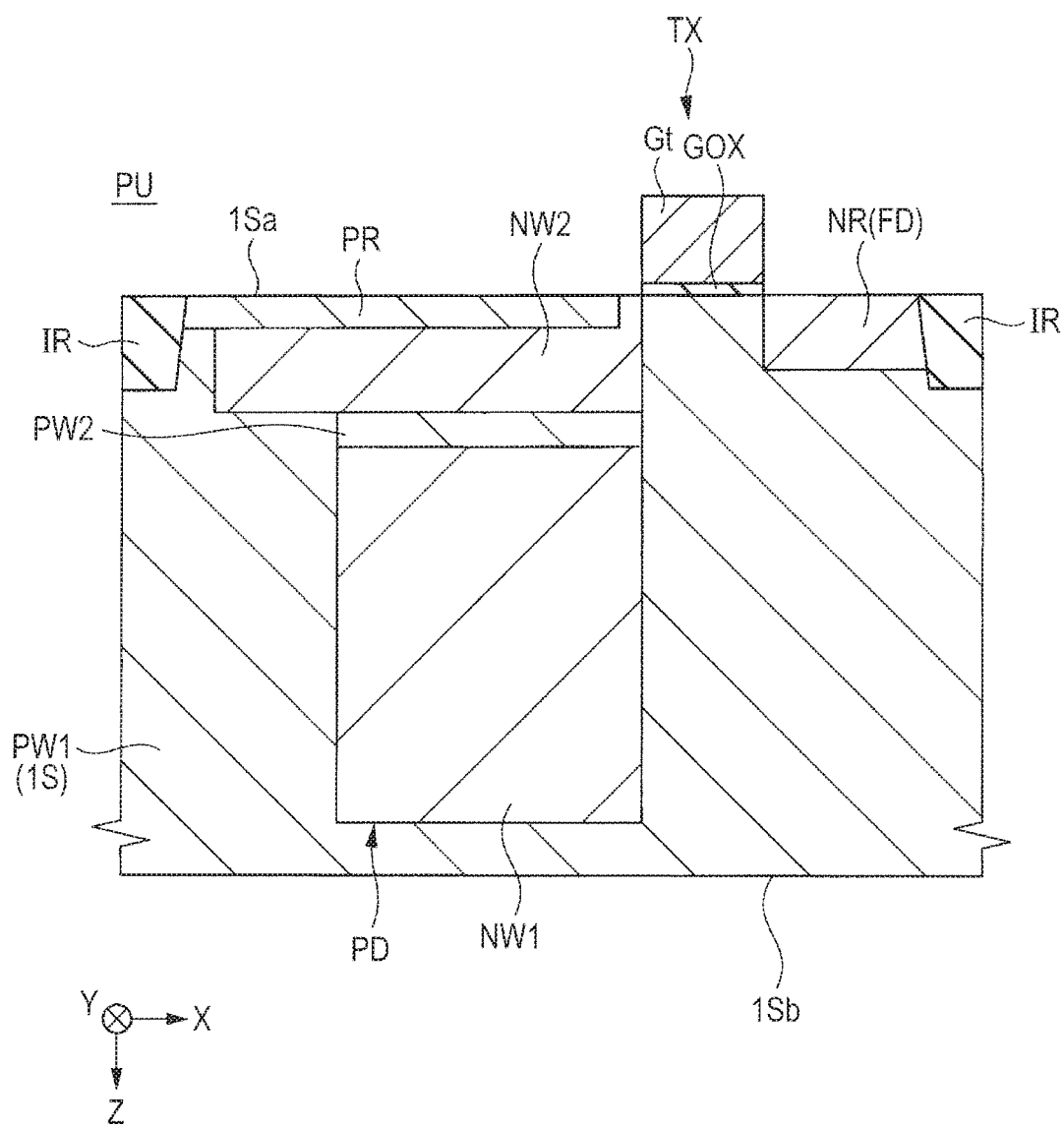
FIG. 26 is a cross sectional view showing a configuration of a semiconductor device of a related technology.
Figure 27:
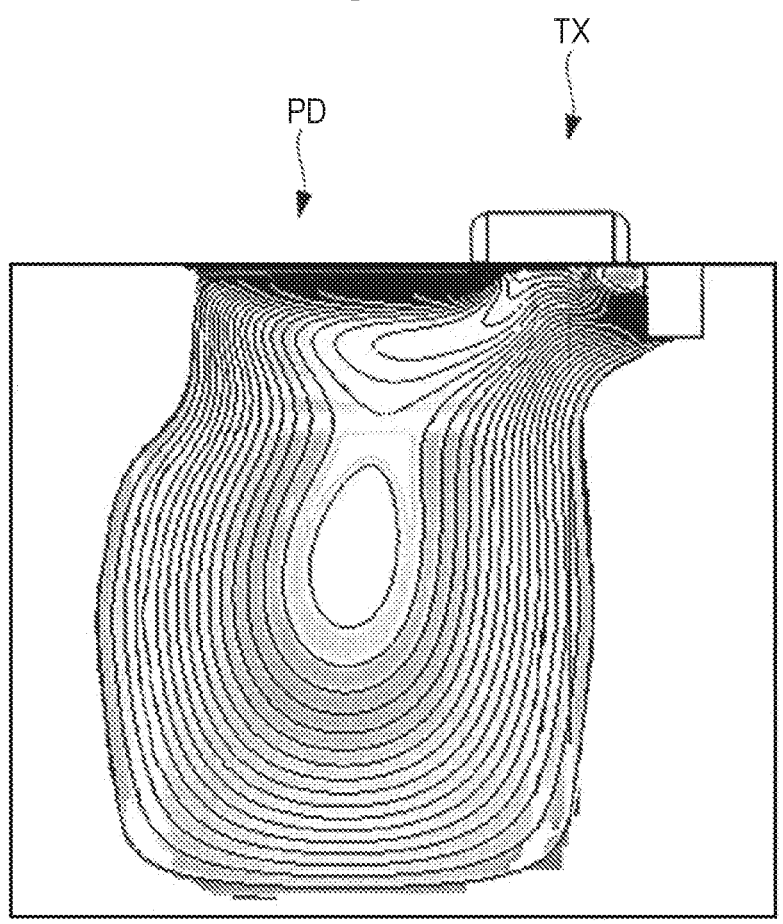
FIG. 27 is a potential block view at the time of charge transfer of the semiconductor device of the related technology.

FIG. 26 is a cross sectional view showing a configuration of a semiconductor device of the related technology. FIG. 27 is a potential structure view at the time of charge transfer of the semiconductor device of the related technology. In other words, FIG. 27 is a view showing the distribution of the depletion region and the electrostatic potential of the photodiode PD after the transfer transistor TX is turned on.

As shown in FIG. 26, a pixel PU has a photodiode PD as a photoelectric conversion element, and a transfer transistor TX for transferring the electric charges accumulated at the photodiode PD to a floating diffusion FD. Then, the pixel PU has a p type semiconductor region (interpixel isolation region, or p type well) PW1, an n type semiconductor region ($n^-$ type semiconductor region) NW1, a p type semiconductor region ($p^-$ type semiconductor region) PW2, an n type semiconductor region NW2, a gate electrode Gt, and an n type semiconductor region ($n^+$ type semiconductor region, or n type high density semiconductor region) NR.

The photodiode PD is formed of the p type semiconductor region PW1, the n type semiconductor region NW2, the p type semiconductor region PW2, and the n type semiconductor region NW1. On the main surface 1Sa side of the semiconductor substrate 1S, the n type semiconductor region NW2 is arranged. Thereunder, the n type semiconductor region NW1 is arranged via the p type semiconductor region PW2. The n type semiconductor region NW1 extends deeply toward the back surface 1Sb side of the semiconductor substrate 1S.

The n type semiconductor region NW1 is formed thickly in the thickness direction of the semiconductor substrate 1S. Accordingly, even when an incident light is made incident upon the portion near the main surface 1Sa and even when an incident light is made incident upon the portion near the back surface 1Sb, the internal quantum efficiency can be ensured.

Further, the n type semiconductor region NW1 is arranged under an n type semiconductor region NW2 via a p type semiconductor region PW2. The impurity density of the p type semiconductor region PW2 is set lower than the impurity density of the p type semiconductor region PW1. This results in an increase in charge transfer efficiency from the n type semiconductor region NW2 to the floating diffusion FD.

If the p type semiconductor region PW2 of FIG. 26 is not present, and the n type semiconductor region NW1 having a relatively lower impurity density is in direct contact with the n type semiconductor region NW2 having a relatively higher impurity density, the potential energy distribution in the depth direction in the n type semiconductor region NW2 is modulated. For this reason, the position at which the potential energy is minimum becomes deeper than in the case where the n type semiconductor region NW1 is not formed, and the potential energy itself is also decreased. Therefore, in the example in which the n type semiconductor region NW1 is in direct contact with the n type semiconductor region NW2, the charge transfer efficiency from the n type semiconductor region NW2 to the floating diffusion FD is reduced as compared with the example in which the n type semiconductor region NW1 is not formed.

Alternatively, if the n type semiconductor region NW1 is arranged under the n type semiconductor region NW2 via the p type semiconductor region PW1 having a relatively higher impurity density, the potential energy distribution in the depth direction has a high potential barrier at the portion in the p type semiconductor region PW1, and between the n type semiconductor regions NW1 and NW2. For this reason, even when the transfer transistor TX is turned on, the electric charges in the n type semiconductor region NW1 cannot be moved into the n type semiconductor region NW1, so that the electric charges are left in the n type semiconductor region NW1.

In contrast, in the semiconductor device of the related technology, the n type semiconductor region NW1 is arranged under the n type semiconductor region NW2 via the p type semiconductor region PW2 having a relatively lower impurity density. This can decrease (reduce) the height of the potential barrier between the p type semiconductor region PW2 and the n type semiconductor region NW1. Further, the position at which the potential energy is minimum in the depth direction can be made shallower than in the example in which the n type semiconductor region NW2 is brought in direct contact with the underside of the n type semiconductor region NW2. Therefore, the charge transfer efficiency from the n type semiconductor regions NW1 and NW2 to the floating diffusion FD is improved.

The present inventors conducted a study on, for example, the expansion of the width (in other words, the area in a plan view) of the n type semiconductor region NW1 in the gate length direction (the X direction of FIG. 26) of the transfer transistor TX, or an increase in density of the n type semiconductor region NW1 for the sensitivity improvement in the semiconductor device of the related technology. However, the depletion potential for fully depleting the n type semiconductor region NW1 when the transfer transistor TX is turned on increases, and the potential energy of the central part of the n type semiconductor region NW1 decreases. For this reason, the charge transfer efficiency of transferring the electric charges accumulated in the n type semiconductor region NW1 into the floating diffusion FD is reduced. This problem was confirmed by the study of the present inventors. FIG. 27 is a potential block view at the time of charge transfer of the semiconductor device of the related technology, and is a potential block view upon expanding the width of the n type semiconductor region NW1. As shown in FIG. 27, the potential energy becomes deeper (lower) locally at the deep part of the photodiode PD. This results in the generation of a barrier between the lower part and the upper part of the photodiode PD. For this reason, the electric charges accumulated in the n type semiconductor region NW1 cannot be transferred into the n type semiconductor region NW2 or the floating diffusion FD, resulting in the reduction of the charge transfer efficiency.

The present embodiment provides a technology of not reducing (or improving) the charge transfer efficiency in a semiconductor device in which the n type semiconductor region NW1 has an expanded width or an increased density. Thus, for example, in the n type semiconductor region NW1, an n type semiconductor region NW3 having a lower density than the impurity density of the n type semiconductor region NW1 is provided.

Configuration of a Semiconductor Device

Figure 2:
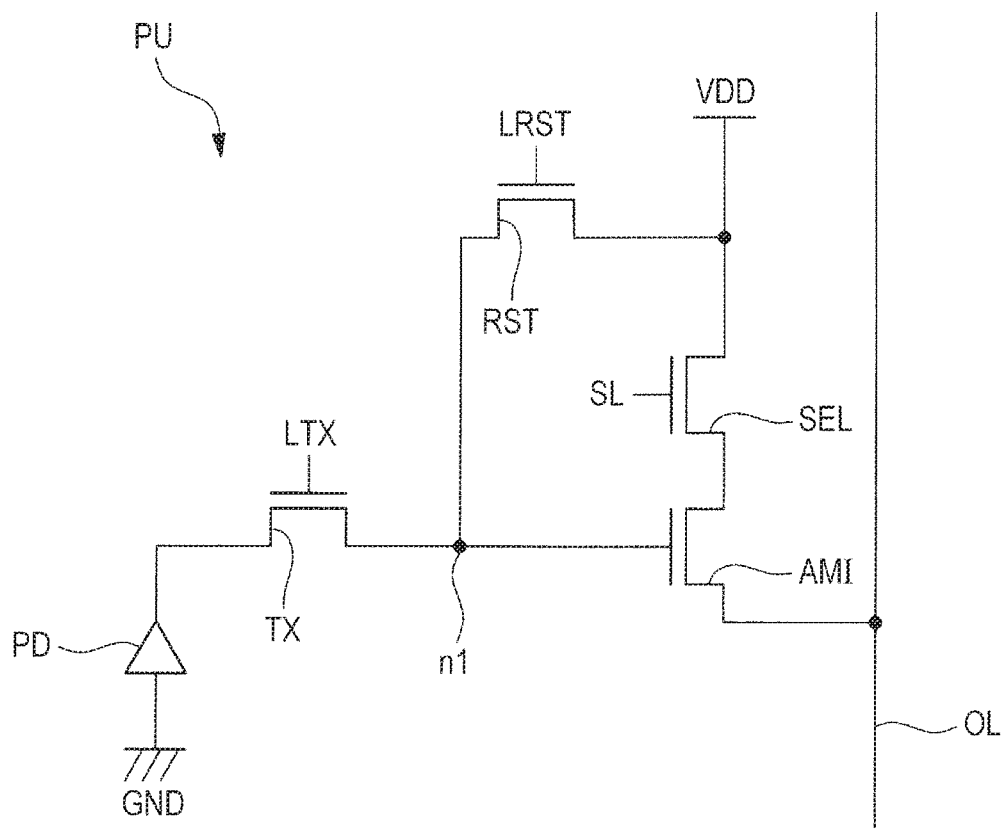
FIG. 2 is a circuit diagram showing a configuration example of a pixel.

FIG. 1 is a circuit block diagram showing a configuration example of a semiconductor device of the present embodiment. FIG. 2 is a circuit diagram showing a configuration example of a pixel. Incidentally, FIG. 1 shows 16 pixels in 4 rows by 4 columns arranged in an array. However, the number of pixels for actual use in electronic devices such as a camera may be several millions.

In the pixel region 1A shown in FIG. 1, a plurality of pixels PU are arranged in an array. Therearound, driving circuits such as a vertical scanning circuit 102 and a horizontal scanning circuit 105 are arranged. Namely, the semiconductor device of the present embodiment has a pixel array including a plurality of pixels PU arranged in an array.

Each pixel PU is arranged at the point of intersection between a selection line SL and an output line OL. The selection line SL is coupled with the vertical scanning circuit 102, and the output lines OL are coupled with column circuits 103, respectively. The column circuits 103 are coupled with an output amplifier 104 via their respective switches Sw. Each switch Sw is coupled with the horizontal scanning circuit 105, and is controlled by the horizontal scanning circuit 105.

For example, the electric signal read from the pixel PU selected by the vertical scanning circuit 102 and the horizontal scanning circuit 105 is outputted via the output line OL and the output amplifier 104.

The pixel PU includes, for example, as shown in FIG. 2, a photodiode PD, and four MOSFETs. The MOSFETs are each of an n channel type. RST is a reset transistor, TX is a transfer transistor, SEL is a selection transistor, and AMI is an amplification transistor. The transfer transistor TX transfers electric charges generated by the photodiode PD. Incidentally, other than the transistors, elements such as other transistors or capacitance elements may be incorporated. Further, as the coupling form for the transistors, various modified examples can be used. Then, a MOSFET is the abbreviation for Metal Oxide Semiconductor Field Effect Transistor, and may also be expressed as MISFET (Metal Insulator Semiconductor Field Effect Transistor). Further, the FET (Field Effect Transistor) is the abbreviation for a field effect transistor.

Incidentally, in the example shown in FIG. 1, a plurality of pixel groups each including four pixels PU in two rows by two columns are arranged in an array. Each of the plurality of pixel groups includes one pixel PU of red (R), two pixels PU of green (G), and one pixel PU of blue (B). Thus, the array of four pixels PU including one pixel PU of red (R), two pixels PU of green (G), and one pixel PU of blue (B) arrayed in two rows by two columns is referred to as a Bayer array.

In the circuit example shown in FIG. 2, in the pixel PU, the photodiode PD and the transfer transistor TX are coupled in series between a ground potential GND and a node n1. Between the node n1 and a power supply potential VDD, the reset transistor RST is coupled. The power supply potential VDD is the potential of the power supply potential line. The selection transistor SEL and the amplification transistor AMI are coupled in series between the power supply potential VDD and the output line OL. The gate electrode of the amplification transistor AMI is coupled with the node n1. Whereas, the gate electrode of the reset transistor RST is coupled with a reset line LRST. Then, the gate electrode of the selection transistor SEL is coupled with the selection line SL, and the gate electrode of the transfer transistor TX is coupled with a transfer line LTX.

The photodiode PD generates electric charges by photoelectric conversion. The transfer transistor TX transfers the electric charges generated by the photodiode PD. The amplification transistor AMI amplifies a signal according to the electric charges transferred by the transfer transistor TX. The selection transistor SEL selects the pixel PU including the photodiode PD and the transfer transistor TX. In other words, the selection transistor SEL selects the amplification transistor AMI. The reset transistor RST erases the electric charges of the photodiode PD.

For example, the transfer line LTX and the reset line LRST are raised, and set at a high level, so that the transfer transistor TX and the reset transistor RST are rendered in an ON state. As a result, the electric charges of the photodiode PD are drawn for depletion. Thereafter, the transfer transistor TX is rendered in an OFF state.

Subsequently, the shutter such as a mechanical shutter of an electronic device such as a camera is opened. Then, during the period in which the shutter is opened, in the photodiode PD, electric charges are generated by an incident light, and are accumulated. Namely, the photodiode PD receives an incident light, and generates electric charges. In other words, the photodiode PD receives an incident light, and converts the light into electric charges.

Then, after closing the shutter, the reset line LRST is lowered and set at a L level, so that the reset transistor RST is rendered in an OFF state. Further, the selection line SL and the transfer line LTX are raised and set at a H level, so that the selection transistor SEL and the transfer transistor TX are rendered in an ON state. As a result, the electric charges generated by the photodiode PD are transferred to the end on the node n1 side of the transfer transistor TX (the floating diffusion FD in FIG. 3 described later). At this step, the signal, namely, the electric potential of the floating diffusion FD changes into a value according to the electric charges transferred from the photodiode PD. The value of the signal is amplified by the amplification transistor AMI, and appears at the output line OL. The signal, namely, the electric potential of the output line OL serves as an electric signal (light receiving signal), and is read as an output signal from the output amplifier 104 via the column circuit 103 and the switch Sw shown in FIG. 1.

Figure 3:
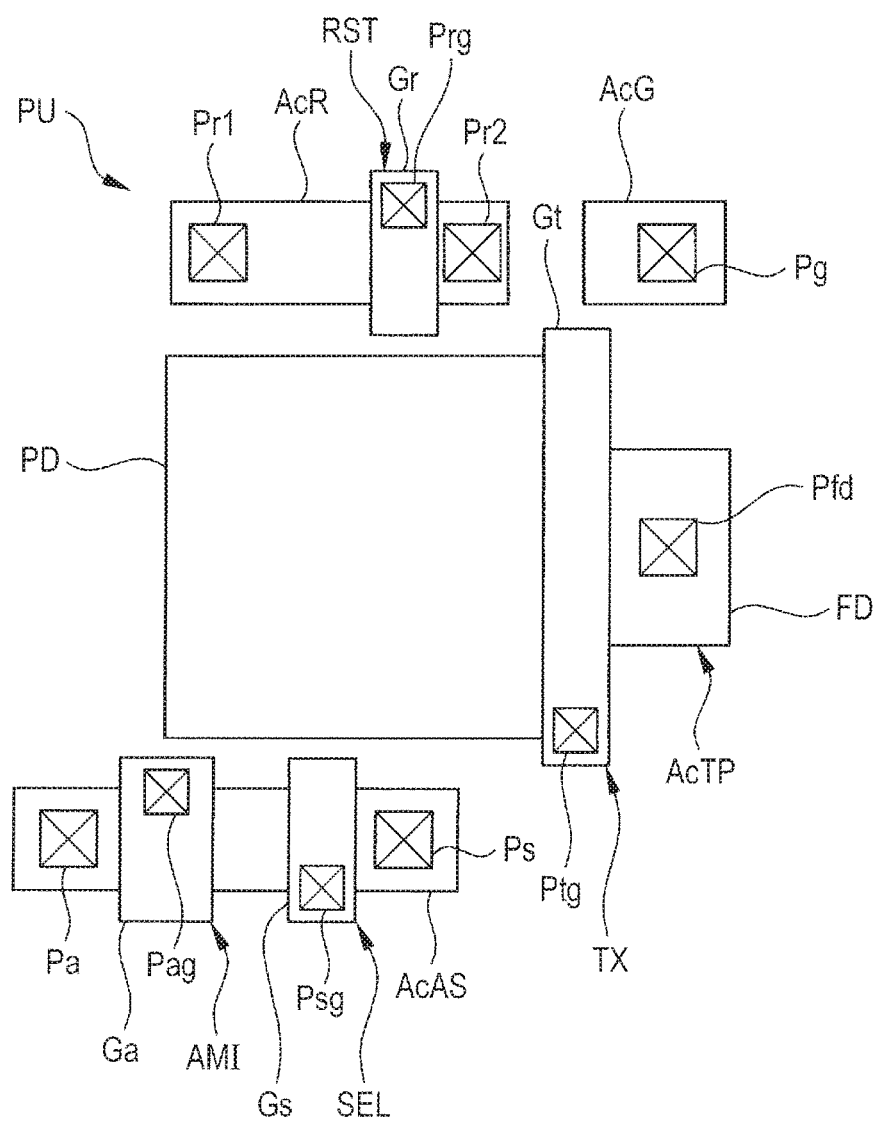
FIG. 3 is a plan view showing a configuration of the semiconductor device of the embodiment.

FIG. 3 is a plan view showing a configuration of the semiconductor device of the present embodiment.

As shown in FIG. 3, the pixel PU of the semiconductor device of the present embodiment has an active region AcTP in which the photodiode PD and the transfer transistor TX are arranged, and an active region AcR in which the reset transistor RST is arranged. Further, the pixel PU has an active region AcAS in which the selection transistor SEL and the amplification transistor AMI are arranged, and an active region AcG in which a plug Pg coupled with a grounding potential line GND (see FIG. 2) is arranged.

In the active region AcR, a gate electrode Gr is arranged, and plugs Pr1 and Pr2 are arranged over the source/drain regions on the opposite sides thereof, respectively. The gate electrode Gr and the source/drain regions form the reset transistor RST.

In the active region AcTP, a gate electrode Gt is arranged. In a plan view, the photodiode PD is arranged on one side of the opposite sides of the gate electrode Gt. Whereas, the floating diffusion FD having a function as the charge accumulation part or the floating diffusion layer is arranged on the other side of the opposite sides of the gate electrode Gt. The photodiode PD is a pn junction diode, and is formed of, for example, a plurality of n type or p type impurity diffusion regions, namely, semiconductor regions. Whereas, the floating diffusion FD is formed of, for example, an n type impurity diffusion region, namely, semiconductor region. A plug Pfd is arranged over the floating diffusion FD.

Incidentally, in the present specification, the wording "in a plan view" means the case of the view as seen from the direction perpendicular to the main surface 1Sa of the semiconductor substrate 1S (see FIG. 5 described later).

In the active region AcAS, a gate electrode Ga and a gate electrode Gs are arranged. A plug Pa is arranged at the end on the gate electrode Ga side of the active region AcAS, and a plug Ps is arranged at the end on the gate electrode Gs side of the active region AcAS. The opposite sides of the gate electrode Ga and the gate electrode Gs are source/drain regions. The gate electrode Ga and the gate electrode Gs, and the source/drain regions form the selection transistor SEL and the amplification transistor AMI coupled in series.

A plug Pg is arranged at the top of the active region AcG. The plug Pg is coupled with the grounding potential line GND (see FIG. 2). Accordingly, the active region AcG is a feeding region for applying a grounding potential GND to the well region of the semiconductor substrate.

The plug Pr1, the plug Pr2, the plug Pg, the plug Pfd, the plug Pa, and the plug Ps are coupled by a plurality of wiring layers (e.g., wires M1 to M3 shown in FIG. 5 described later). Further, the plug Prg, the plug Ptg, the plug Pag, and the plug Psg respectively over the gate electrode Gr, the gate electrode Gt, the gate electrode Ga, and the gate electrode Gs are coupled by a plurality of wiring layers (e.g., the wires M1 to M3 shown in FIG. 5 described later). This can form the circuit shown in FIG. 1.

Incidentally, in the periphery of the pixel region 1A (see FIG. 1), a peripheral circuit region (not shown) may be provided. In the peripheral circuit region, a logic transistor may be arranged. The logic transistor is formed of an N type MOSFET (NMOSFET) using electrons as carriers, and a P type MOSFET using holes as carriers. In the peripheral circuit region, a gate electrode is arranged in an active region, and source/drain regions are formed on the opposite sides of the gate electrode, and in the inside of the active region. Whereas, the plugs are arranged over the source/drain regions.

Element Structure of a Pixel Region

Figure 4:
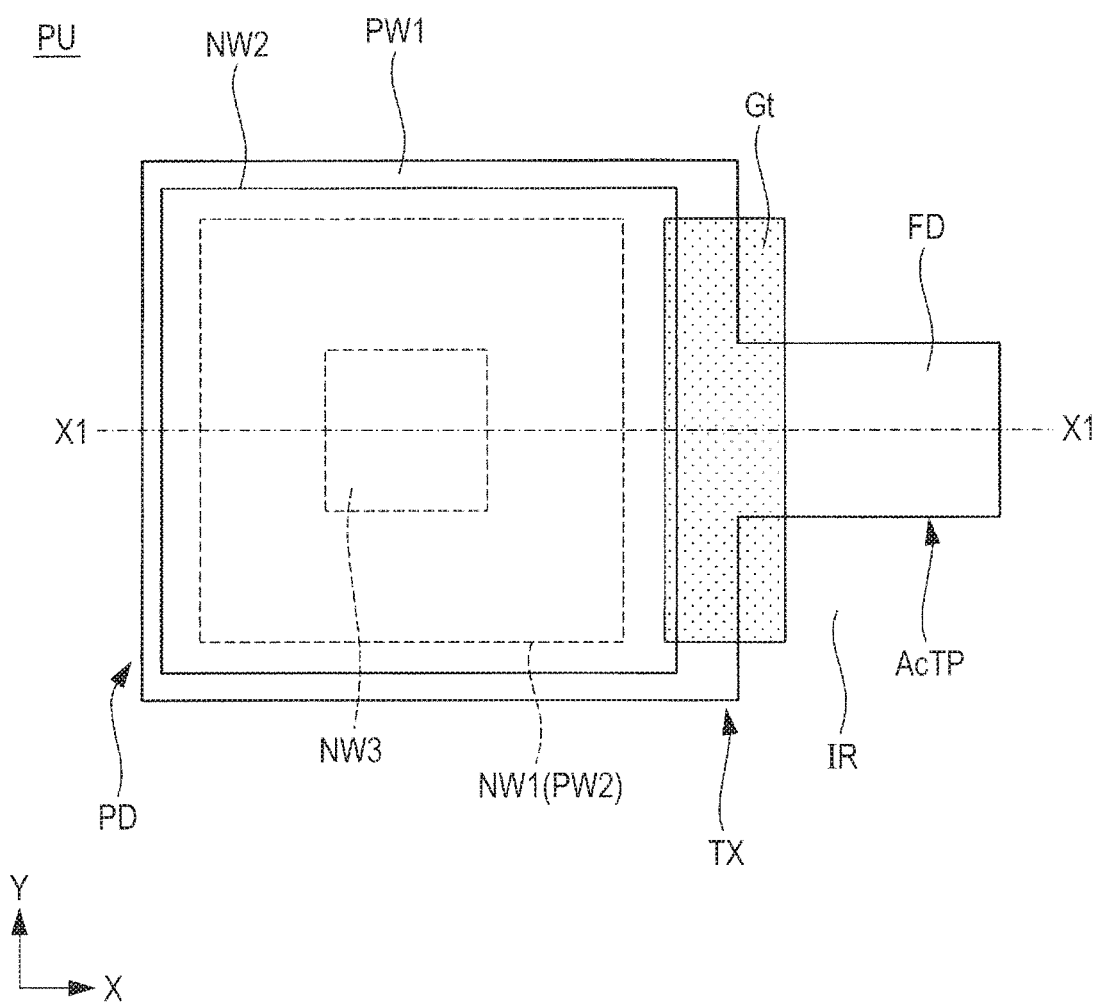
FIG. 4 is a plan view showing a configuration of the semiconductor device of the embodiment.

Then, the element structure of the pixel region will be described. FIG. 4 is a plan view showing a configuration of the semiconductor device of the present embodiment. FIG. 5 is a cross sectional view along X1-X1 of FIG. 4. Incidentally, FIGS. 4 and 5 each show the element structure of the pixel region 1A (see FIG. 1). Incidentally, FIG. 5 shows the configuration of the photodiode PD and the transfer transistor TX.

Figure 5:
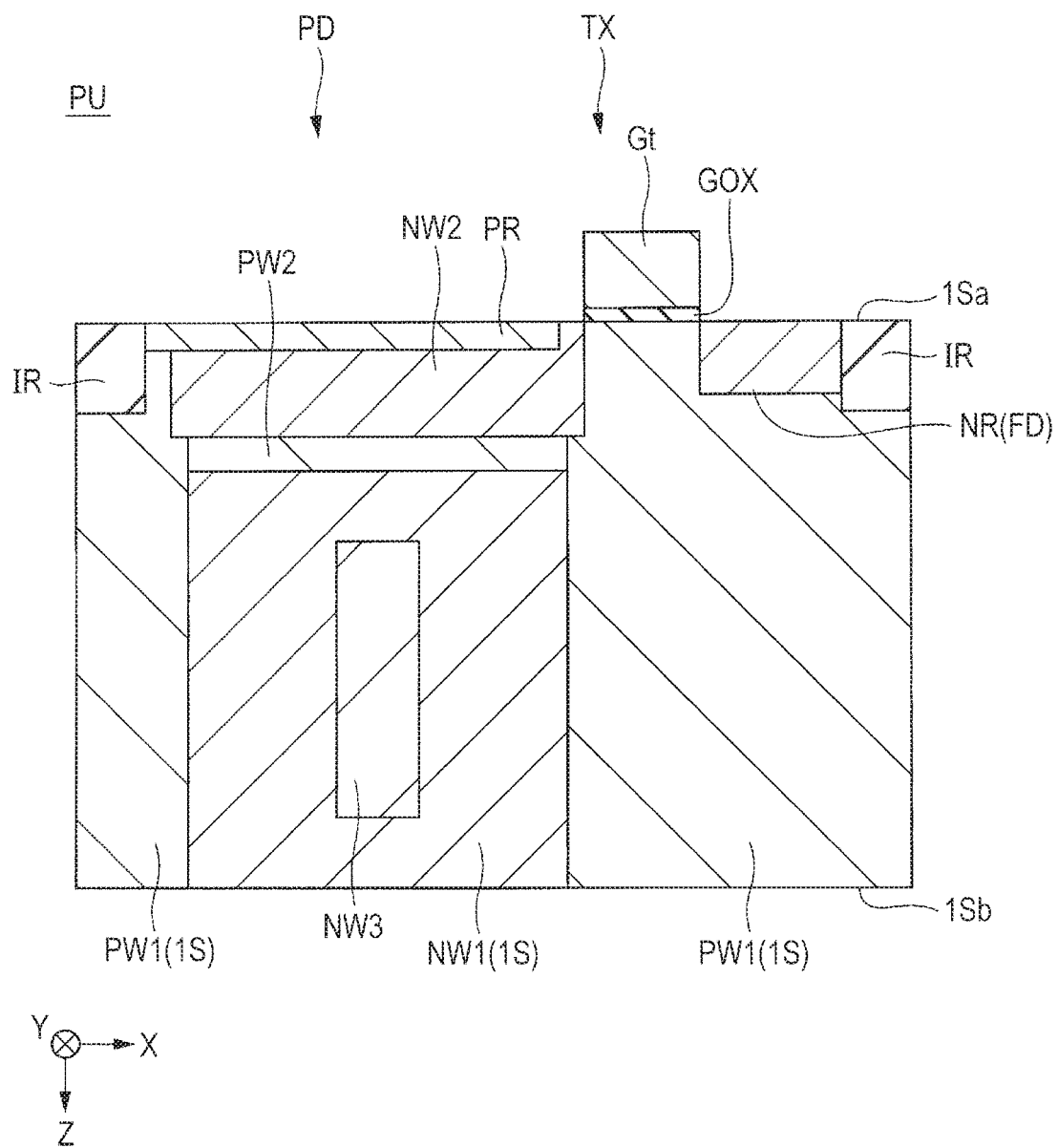
FIG. 5 is a cross sectional view along X1-X1 of FIG. 4.

As shown in FIG. 5, the semiconductor device of the present embodiment has a semiconductor substrate 1S, and an active region AcTP of a semiconductor region formed in some region on the main surface 1Sa side of the semiconductor substrate 1S. In the active region AcTP of a part of the pixel PU, the photodiode PD and the transfer transistor TX are formed. Namely, the semiconductor device of the present embodiment has the pixel PU. The pixel PU has the photodiode PD as a photoelectric conversion element.

Further, the pixel PU has a p type semiconductor region (interpixel isolation region or p type well) PW1, an n type semiconductor region (n⁻ type semiconductor region) NW1, an n type semiconductor region NW2, an n type semiconductor region (n⁻⁻ type semiconductor region) NW3, a p type semiconductor region (p⁻ type semiconductor region) PW2, a gate electrode Gt, and an n type semiconductor region (n⁺ type semiconductor region or n type high density semiconductor region) NR. Incidentally, FIG. 5 shows a state in which the back surface 1Sb of the semiconductor substrate 1S is polished to make the semiconductor substrate 1S thin.

As shown in FIG. 5, in the active region AcTP of some region on the main surface 1Sa side of the semiconductor substrate 1S, the photodiode PD including the p type semiconductor region PW1, the n type semiconductor region NW1, the p type semiconductor region PW2, the n type semiconductor region NW2, and the n type semiconductor region NW3, and the transfer transistor TX are formed.

The semiconductor substrate 1S is, for example, a single crystal silicon containing a p type impurity (acceptor) such as boron (B). An element isolation region IR is arranged in the outer periphery of the active region AcTP. Thus, the region surrounded by the element isolation region IR serves as the active region such as the active region AcTP.

In the active region AcTP, the p type semiconductor region PW1 as the semiconductor region doped with a p type impurity such as boron (B) is formed. The p type semiconductor region PW1 is formed, namely, arranged from the main surface 1Sa through to the back surface 1Sb of the semiconductor substrate 1S. The conductivity type of the p type semiconductor region PW1 is a p type. The p type semiconductor region PW1 is a region for isolating the photodiodes PD of the adjacent pixels PU, and specifically establishes an electric isolation between the n type semiconductor regions NW1 and NW2 of the adjacent pixels PU.

In the region surrounded by the p type semiconductor region PW1, the n type semiconductor region NW1 doped with an n type impurity such as phosphorus (P) or arsenic (As) is formed in such a manner as to be separated from the main surface 1Sa, and as to reach the back surface 1Sb. Namely, the whole circumference of the n type semiconductor region NW1 is surrounded by the p type semiconductor region PW1. The conductivity type of the n type semiconductor region NW1 is an n type. Specifically, the impurity density in the n type semiconductor region NW1 can be set at, for example, about $5 \times 10^{15}$ to $5 \times 10^{16}$ cm$^{-3}$.

Incidentally, the conductivity type being a p type means that the major carriers in the semiconductor are holes. The conductivity type being an n type means that the major carriers in the semiconductor are electrons.

Over the portion of the p type semiconductor region PW1 situated closer to a first side (the right side in FIG. 5) than the n type semiconductor region NW1 in a plan view, a gate electrode Gt is formed, namely, arranged, via a gate insulation film GOX. The gate insulation film GOX is formed of, for example, a silicon oxide film, and the gate electrode Gt is formed of, for example, a polycrystal silicon film (polysilicon film).

Between the n type semiconductor region NW1 and the main surface 1Sa, the n type semiconductor region NW2 doped with an n type impurity such as phosphorus (P) or arsenic (As) is formed. Namely, the n type semiconductor region NW2 is, in a plan view, surrounded therearound by the p type semiconductor region PW1, and is arranged closer to the main surface 1Sa than the n type semiconductor region NW1. The conductivity type of the n type semiconductor region NW2 is an n type. Specifically, the impurity density in the n type semiconductor region NW2 can be set at, for example, about $5 \times 10^{16}$ to $5 \times 10^{17}$ cm$^{-3}$.

The impurity density of the n type semiconductor region NW1 is lower than the impurity density of the n type semiconductor region NW2. This can readily deplete the n type semiconductor region NW1.

The p type semiconductor region PW2 is formed between the n type semiconductor region NW1 and the n type semiconductor region NW2. The conductivity type of the p type semiconductor region PW2 is a p type. The lower end (the end on the back surface 1Sb side) of the p type semiconductor region PW2 is in contact with the n type semiconductor region NW1, and the upper end (the end on the main surface 1Sa side) of the p type semiconductor region PW2 is in contact with the n type semiconductor region NW2.

The impurity density in the p type semiconductor region PW2 is lower than the impurity density in the p type semiconductor region PW1. This can make it difficult to deplete the p type semiconductor region PW1, and can make it easy to deplete the p type semiconductor region PW2. Further, as described previously, the impurity density in the n type semiconductor region NW1 is lower than the net impurity density in the n type semiconductor region NW2. For this reason, in the depth direction, the portion from the p type semiconductor region PW2 through to the n type semiconductor region NW1 can be continuously depleted.

Specifically, the impurity density in the p type semiconductor region PW1 can be set at, for example, about $1 \times 10^{16}$ to $1 \times 10^{17}$ cm$^{-3}$, and the impurity density in the p type semiconductor region PW2 can be set at, for example, about $1 \times 10^{15}$ to $1 \times 10^{16}$ cm$^{-3}$.

At the portion situated opposite to the n type semiconductor region NW1 across the gate electrode Gt in a plan view, an n type semiconductor region NR doped with an n type impurity such as phosphorus (P) or arsenic (As) is formed, namely, arranged. The n type impurity density in the n type semiconductor region NR is higher than the n type impurity density in the n type semiconductor region NW2.

In the inside of the n type semiconductor region NW1, the n type semiconductor region NW3 is formed, namely, arranged. The impurity density of the n type semiconductor region NW3 can be set lower than the impurity density of the n type semiconductor region NW1, for example, at about $1 \times 10^{14}$ to $1 \times 10^{15}$ cm$^{-3}$. The n type semiconductor region NW3 is arranged at the central part of the n type semiconductor region NW1 in the gate length direction (the X direction of FIG. 5) of the transfer transistor TX. Then, as shown in FIG. 4, in the X direction of FIG. 4 (in other words, the gate length direction of the transfer transistor TX) and the Y direction (in other words, the gate width direction of the transfer transistor TX), the n type semiconductor region NW3 is arranged at the central part of the n type semiconductor region NW1.

The p type semiconductor region PW1, the n type semiconductor region NW1, the n type semiconductor region NW2, the n type semiconductor region NW3, and the p type semiconductor region PW2 form the photodiode PD. As shown in FIGS. 4 and 5, in the X direction, the photodiode PD is formed opposite to the n type semiconductor region NR across the gate electrode Gt. Then, the gate electrode Gt and the n type semiconductor region NR form the transfer transistor TX for transferring the electric charges generated at the photodiode PD. Namely, the gate electrode Gt is the gate electrode of the transfer transistor TX. Whereas, the n type semiconductor region NR is the drain region of the transfer transistor TX, and is also a semiconductor region as the floating diffusion FD having a function as a charge accumulation part or a floating diffusion layer.

On the main surface 1Sa side of the n type semiconductor region NW2, a p type semiconductor region ($p^+$ type semiconductor region) PR may be formed. The impurity density in the p type semiconductor region PR is higher than the impurity density in the p type semiconductor region PW1. The p type semiconductor region PR is formed for the purpose of suppressing the generation of electrons based on a large number of interface states formed at the surface of the semiconductor substrate 1S. Namely, in the surface region of the semiconductor substrate 1S, under the influence of the interface state, electrons are generated even in a non-light-irradiated state, which may cause an increase in dark current. For this reason, by forming the p type semiconductor region PR using holes as major carriers at the surface of the n type semiconductor region NW2 using electrons as major carriers, it is possible to suppress the generation of electrons in a non-light-irradiated state, and it is possible to suppress the increase in dark current. The impurity density of the p type semiconductor region PR can be set at, for example, about $1 \times 10^{18}$ to $1 \times 10^{19}$ $cm^{-3}$.

At this step, the p type semiconductor region PW1, the n type semiconductor region NW1, then type semiconductor region NW2, the n type semiconductor region NW3, the p type semiconductor region PW2, and the p type semiconductor region PR form the photodiode PD.

Incidentally although not shown, a $p^+$ type semiconductor region may be formed in such a manner as to surround the active region AcTP. The $p^+$ type semiconductor region can be formed at, for example, the portion situated under the element isolation region IR. The p type impurity density in the $p^+$ type semiconductor region is higher than the impurity density in the p type semiconductor region PW1. This can suppress the transfer of electric charges generated by photoelectric conversion resulting from incidence of an incident light upon a given pixel PU by the transfer transistor TX of another pixel PU adjacent to the pixel PU, namely, the crosstalk between the adjacent pixels PU.

Figure 6:
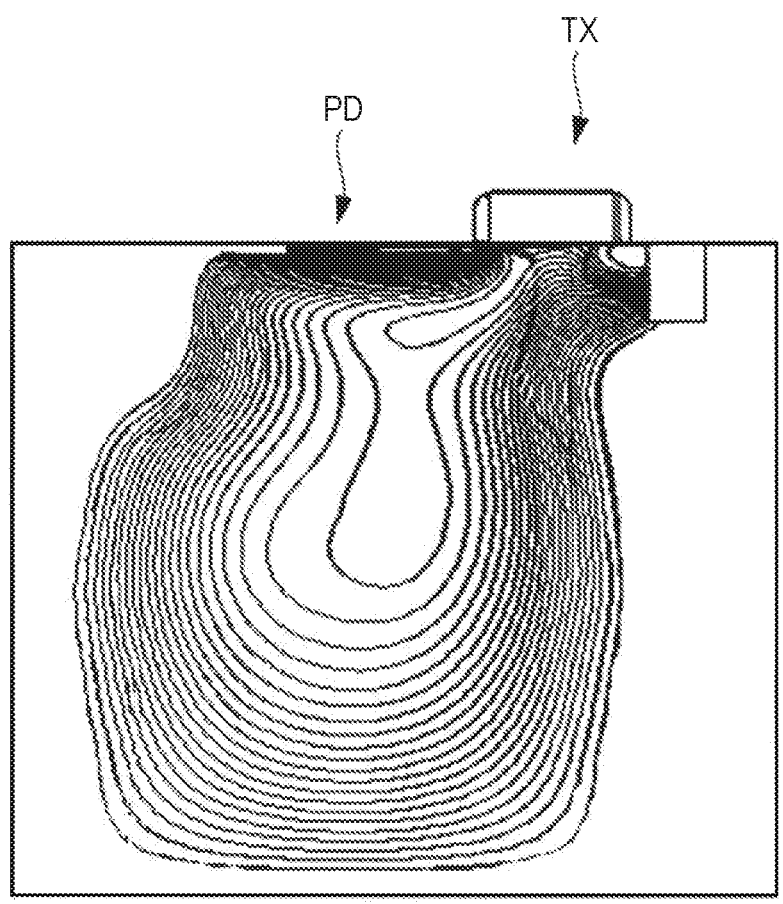
FIG. 6 is a potential block view at the time of charge transfer of the semiconductor device of the embodiment.

FIG. 6 is a potential block view at the time of charge transfer of the semiconductor device of the present embodiment. As shown in FIG. 6, the view has a gentle tilt from the deep part (the back surface 1Sb side of FIG. 5) of the photodiode PD, which can indicate that the charge transfer efficiency is improved. In other words, the charge transfer residue in the n type semiconductor region NW1 of the photodiode PD ceased to be generated.

In short, the p type semiconductor region PW2 having a lower impurity density than the impurity density of the p type semiconductor region PW1 was provided between the n type semiconductor region NW1 and the n type semiconductor region NW2, and the n type semiconductor region NW3 having a lower impurity density than the impurity density of the n type semiconductor region NW1 was provided in the n type semiconductor region NW1. With this configuration, as shown in FIG. 6, in the X direction and the Z direction, a gentle potential energy distribution can be obtained. Therefore, the charge transfer efficiency can be improved. Further, in contrast to the related technology, the depletion potential of the n type semiconductor region NW1 can be reduced. For this reason, the charge transfer efficiency can be improved.

Further, the expansion of the width (in other words, the area in a plan view) of the n type semiconductor region NW1 can improve the sensitivity of the photodiode PD.

Incidentally, in the X direction and the Y direction of FIG. 5, a plurality of n type semiconductor regions NW3 may be formed in the n type semiconductor region NW1.

Method for Manufacturing a Semiconductor Device

Figure 7:
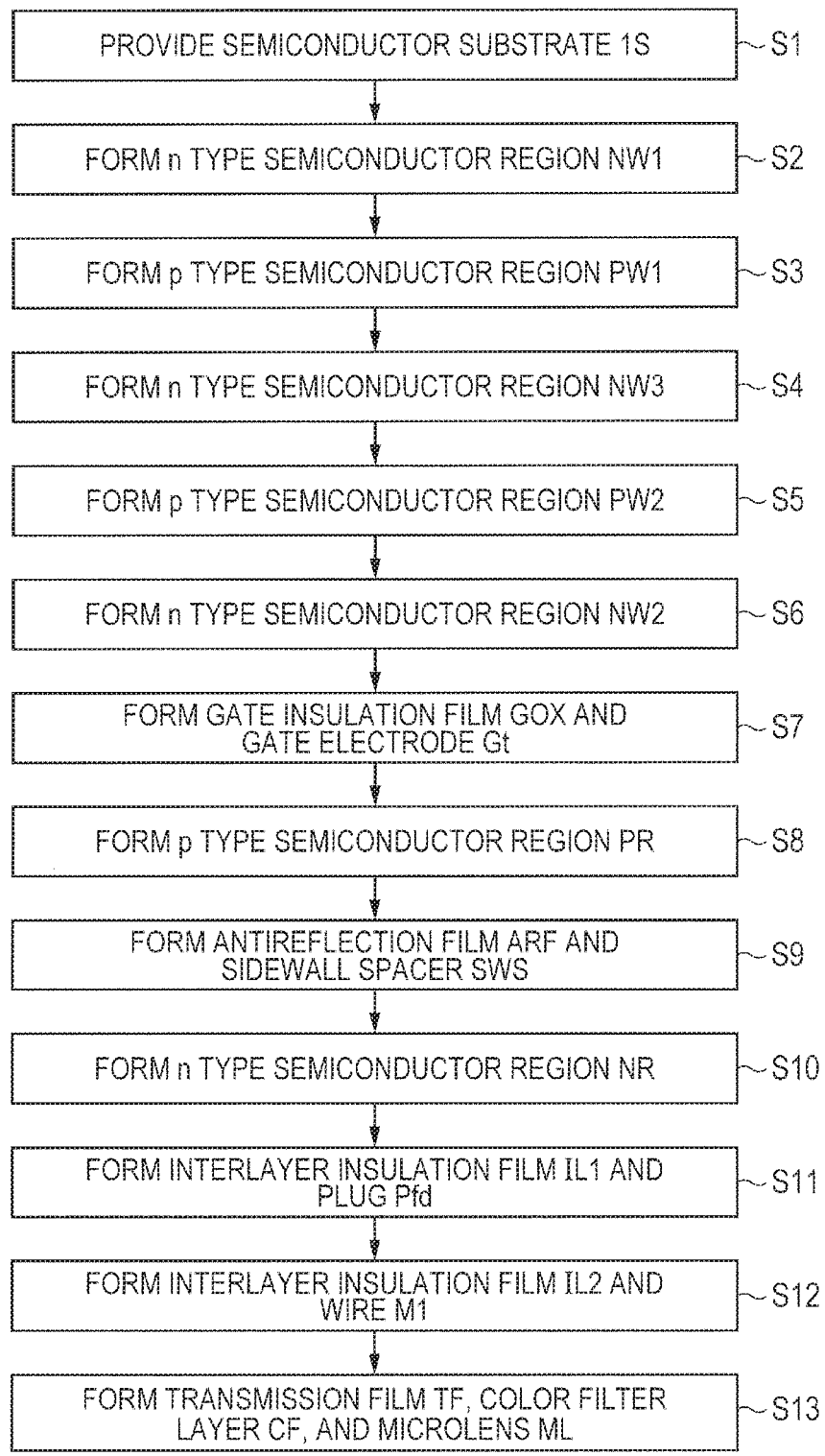
FIG. 7 is a manufacturing process flowchart showing some of manufacturing steps of the semiconductor device of the embodiment.

Then, a description will be given to a method for manufacturing a semiconductor device of the present embodiment. FIG. 7 is a manufacturing process flowchart of some of the manufacturing steps of the semiconductor device of the present embodiment. FIGS. 8 to 19 are each a cross sectional view showing the semiconductor device of the present embodiment during a manufacturing step. Incidentally, each cross sectional view of FIGS. 8 to 19 corresponds to the cross sectional view of FIG. 5. Incidentally, FIGS. 8 to 18 each also show a state in which the back surface 1Sb of the semiconductor substrate 1S is polished to make the semiconductor substrate 1S thin as with FIG. 5.

Figure 8:
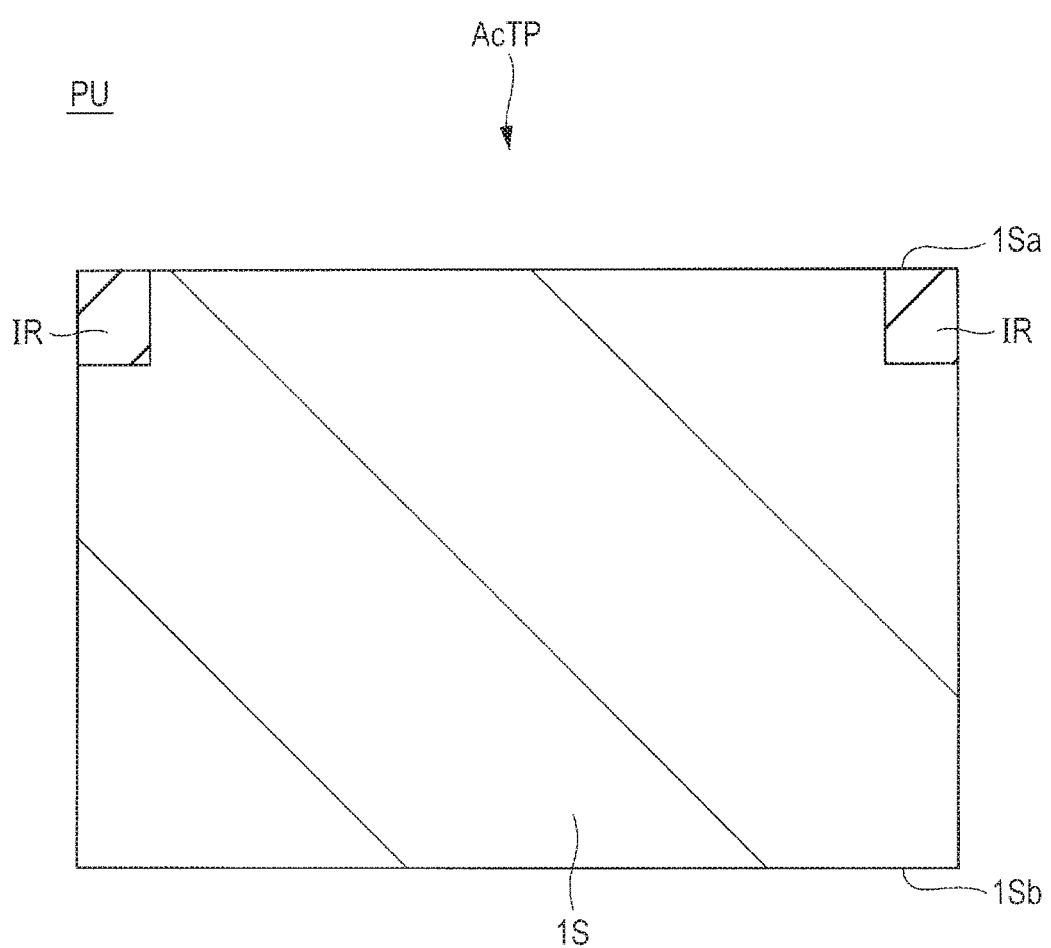
FIG. 8 is a cross sectional view showing the semiconductor device of the embodiment during a manufacturing step.

First, as shown in FIG. 8, a semiconductor substrate 1S is provided (Step S1 of FIG. 7). In the Step S1, as the semiconductor substrate 1S, a p type single crystal silicon substrate containing a p type impurity such as boron (B) is provided.

Then, an element isolation region IR is formed at the main surface 1Sa of the semiconductor substrate 1S. The element isolation region IR is formed of an insulation member embedded in the trench in the semiconductor substrate 1S. For example, using a silicon nitride (SiN) film as a mask, the semiconductor substrate 1S is etched. As a result, an isolation trench is formed in such a manner as to surround the region serving as the active region such as the active region AcTP of the semiconductor substrate 1S. Then, an insulation film such as a silicon oxide ($SiO_2$) film is embedded in the inside of the isolation trench, thereby to form the element isolation region IR. Such an element isolation method is referred to as the STI (Shallow Trench Isolation) method. The element isolation region IR defines, namely, forms the active region such as the active region AcTP.

Incidentally, using a LOCOS (Local oxidation of silicon) method in place of a STI method, the element isolation region may be formed. In this case, the element isolation region is formed of a thermal oxide film. For example, the regions serving as the active regions such as the active regions AcTP and AcL of the semiconductor substrate 1S are covered with a silicon nitride film, and are thermally oxidized. As a result, the element isolation region formed of an insulation member such as a silicon oxide film is formed at the main surface 1Sa of the semiconductor substrate 1S.

Further, although not shown, the isolation trench is formed in such a manner as to surround the region serving as the active region such as the active region AcTP of the semiconductor substrate 1S. Then, before embedding an insulation film such as a silicon oxide ($SiO_2$) film, the exposed portion at the bottom of the isolation trench may be doped with a p type impurity such as boron (B). As a result, as described previously, it is possible to suppress the generation of a dark current at the portion under the element isolation region IR.

Figure 9:
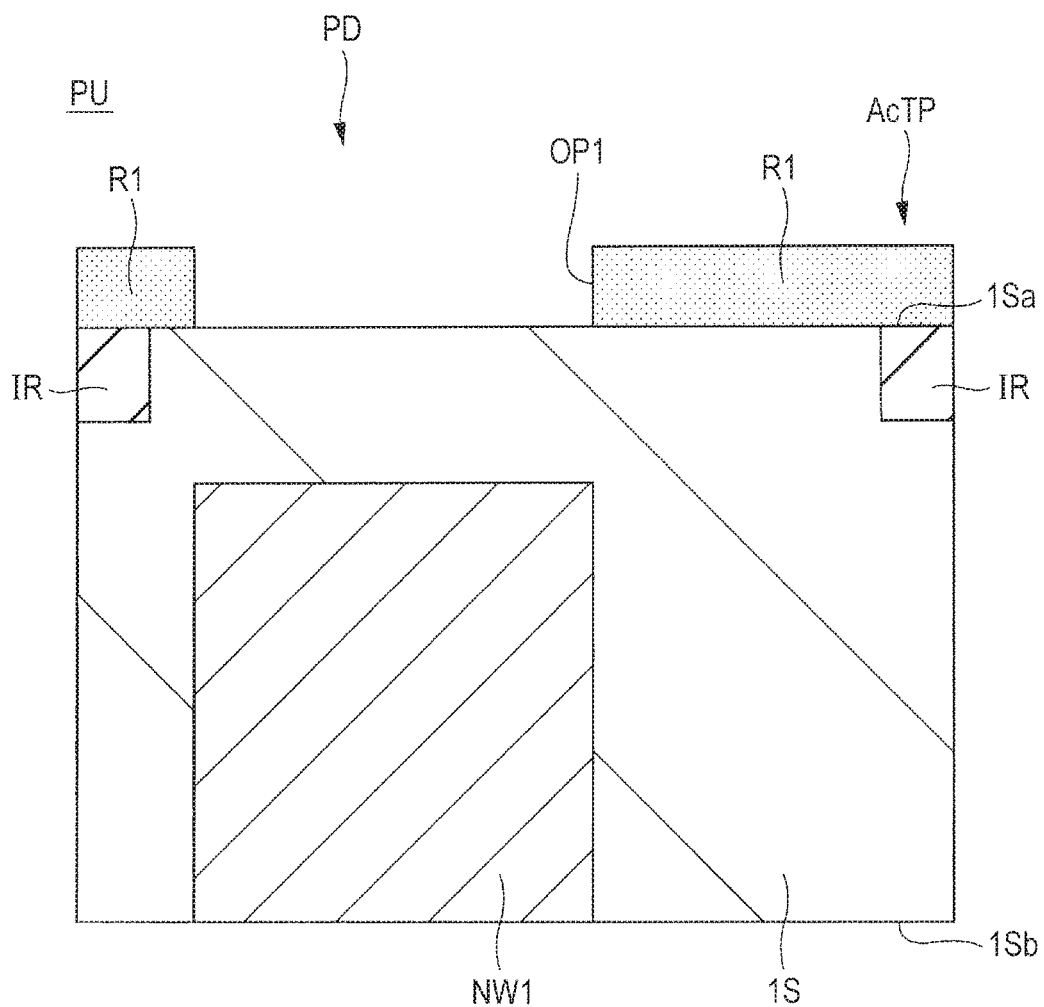
FIG. 9 is a cross sectional view showing the semiconductor device of the embodiment during a manufacturing step.

Then, as shown in FIG. 9, the n type semiconductor region NW1 is formed (Step S2 of FIG. 7). In the Step S2, using a photolithography technology, a photoresist film R1 having an opening OP1 is formed over the main surface 1Sa of the semiconductor substrate 1S. Using the photoresist film R1 as a mask for ion implantation, at the opening OP1, an n type impurity ion such as phosphorus (P) or arsenic (As) is implanted into the semiconductor substrate 1S. The opening OP1 is situated in the active region AcTP. The n type semiconductor region NW1 is formed in the active region AcTP. Further, the n type semiconductor region NW1 is formed in such a manner as to extend from the position separated from the main surface 1Sa to the back surface 1Sb of the semiconductor substrate 1S. Incidentally, at the stage before polishing the back surface 1Sb of the semiconductor substrate 1S, and making the semiconductor substrate 1S thin, the lower end of the n type semiconductor region NW1 (the end on the back surface 1Sb side) does not extend to the back surface 1Sb of the semiconductor substrate 1S, and is situated in the inside of the semiconductor substrate 1S. Further, the conductivity type of the n type semiconductor region NW1 is an n type, and is the conductivity type opposite to a p type of the conductivity type of the semiconductor substrate 1S.

As described previously, the impurity density of the n type semiconductor region NW1 can be set at, for example, about $5 \times 10^{15}$ to $5 \times 10^{16}$ $cm^{-3}$. Then, in order to form the n type semiconductor region NW1 having such an impurity density, in Step S2, for example, phosphorus (P) or arsenic (As) as an n type impurity is ion implanted. As the implantation conditions for implanting, for example, phosphorus (P) as an impurity, the implantation energy can be set at, for example, about 500 keV to 2.5 MeV, and the dose amount can be set at, for example, about $3 \times 10^{11}$ to $1 \times 10^{12}$ $cm^{-2}$. Further, while reducing the implantation energy stepwise, ion implantation can be performed by a plurality of divided steps. For example, by three ion implantations of the implantation energy of 2200 keV, and the dose amount of about $5 \times 10^{11}$ to $1 \times 10^{12}$ $cm^{-2}$ as the implantation conditions for the first stage, the implantation energy of 1500 keV, and the dose amount of about $5 \times 10^{11}$ to $1 \times 10^{12}$ $cm^{-2}$ as the implantation conditions for the second stage, and the implantation energy of 700 keV, and the dose amount of $5 \times 10^{11}$ to $1 \times 10^{12}$ $cm^{-2}$ as the implantation conditions for the third stage, the n type semiconductor region NW1 can be formed. As a result, it is possible to precisely control the impurity density distribution from the back surface 1Sb side to the portion close to the main surface 1Sa, namely the shallow portion of the n type semiconductor region NW1.

In the Step S2, after implanting an n type impurity ion into the semiconductor substrate 1S, and thereby doping the n type impurity, at temperatures as high as, for example, about 1000° C., activation annealing can be performed, thereby to activate the n type impurity doped by ion implantation.

Figure 10:
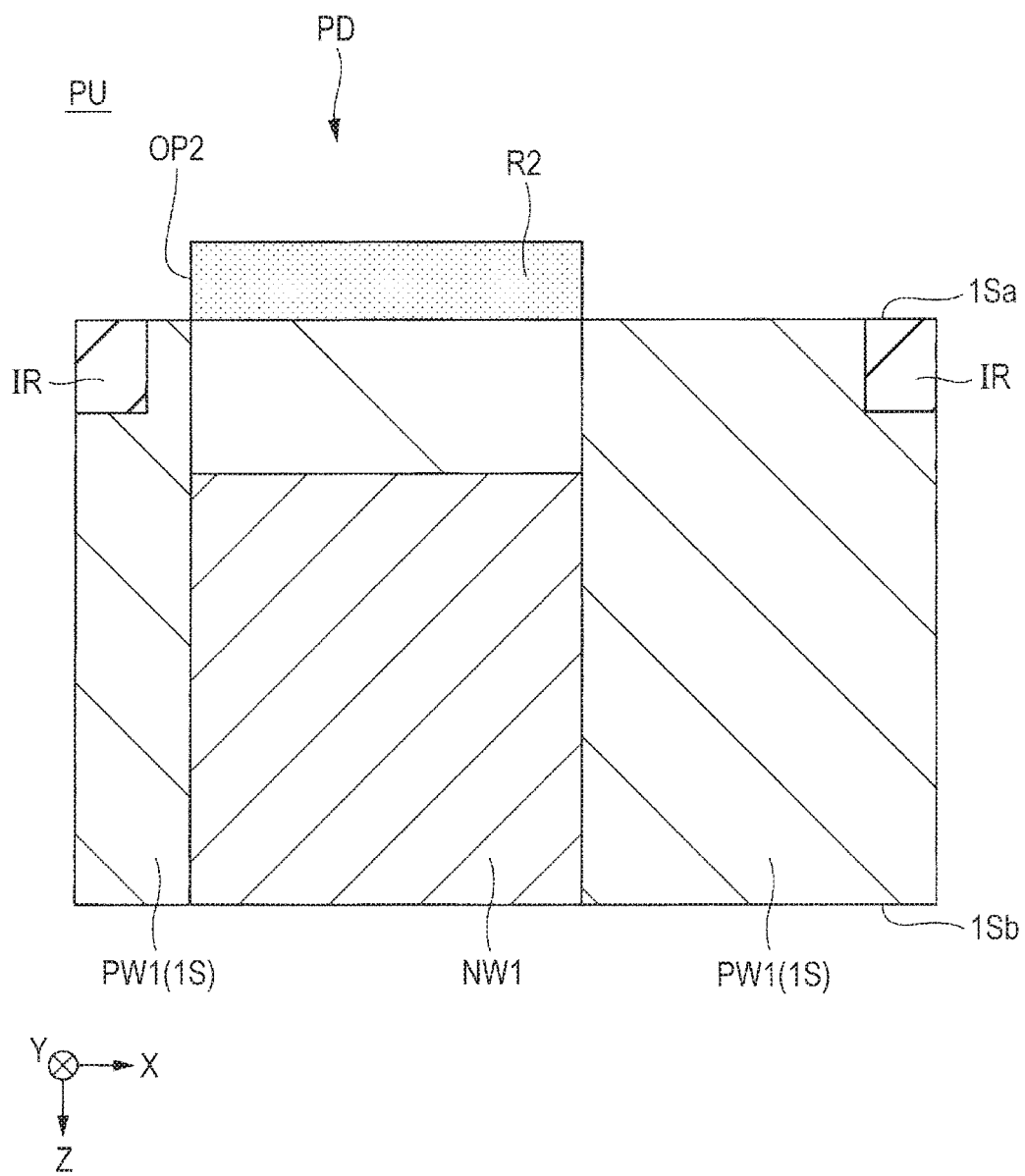
FIG. 10 is a cross sectional view showing the semiconductor device of the embodiment during a manufacturing step.

Then, as shown in FIG. 10, the p type semiconductor region PW1 is formed (Step S3 of FIG. 7). As with the Step S2, using a photolithography technology, a photoresist film R2 having an opening OP2 is formed over the main surface 1Sa of the semiconductor substrate 1S. The photoresist film R2 has an inverted pattern of the photoresist film R1, and has an opening OP2 covering the region including the n type semiconductor region NW1 formed therein, and exposing other regions. The p type semiconductor region PW1 is formed continuously in such a manner as to extend from the main surface 1Sa to the back surface 1Sb of the semiconductor substrate 1S. Incidentally, at the stage before polishing the back surface 1Sb of the semiconductor substrate 1S, and making the semiconductor substrate 1S thin, the lower end (the end on the back surface 1Sb side) of the p type semiconductor region PW1 is preferably set equal to, or deeper than the lower end (the end on the back surface 1Sb side) of the n type semiconductor region NW1.

As described previously, the impurity density of the p type semiconductor region PW1 can be set at, for example, about $1 \times 10^{16}$ to $1 \times 10^{17}$ $cm^{-3}$. In order to form the p type semiconductor region PW1, in Step S3, boron (B) can be used as an impurity, the implantation energy can be set at, for example, 100 KeV to 1.5 MeV, and the dose amount can be set at, for example, about $3 \times 10^{11}$ to $6 \times 10^{12}$ $cm^{-2}$. Further, while reducing the implantation energy stepwise, ion implantation can be performed by a plurality of divided steps. For example, the implantation energy of 120 keV, and the dose amount of about $5 \times 10^{11}$ to $6 \times 10^{12}$ $cm^{-2}$ are set as the implantation conditions for the first stage, the implantation energy of 900 keV, and the dose amount of about $5 \times 10^{11}$ to $6 \times 10^{12}$ $cm^{-2}$ are set as the implantation conditions for the second stage, and the implantation energy of 500 keV, and the dose amount of about $5 \times 10^{11}$ to $6 \times 10^{12}$ $cm^{-2}$ are set as the implantation conditions for the third stage. Further, the implantation energy of 300 keV, and the dose amount of about $5 \times 10^{11}$ to $6 \times 10^{12}$ $cm^{-2}$ are set as the implantation conditions for the fourth stage, and the implantation energy of 180 keV, and the dose amount of about $5 \times 10^{11}$ to $6 \times 10^{12}$ $cm^{-2}$ are set as the implantation conditions for the fifth stage. By a total of five ion implantations described above, the p type semiconductor region PW1 can be formed. As a result, it is possible to precisely control the impurity density distribution from the main surface 1Sa side to the back surface 1Sb of the p type semiconductor region PW1.

In the Step S3, after implanting a p type impurity ion into the semiconductor substrate 1S, and thereby doping the p type impurity, at temperatures as high as, for example, about 1000° C., activation annealing can be performed, thereby to activate the p type impurity doped by ion implantation.

Figure 11:
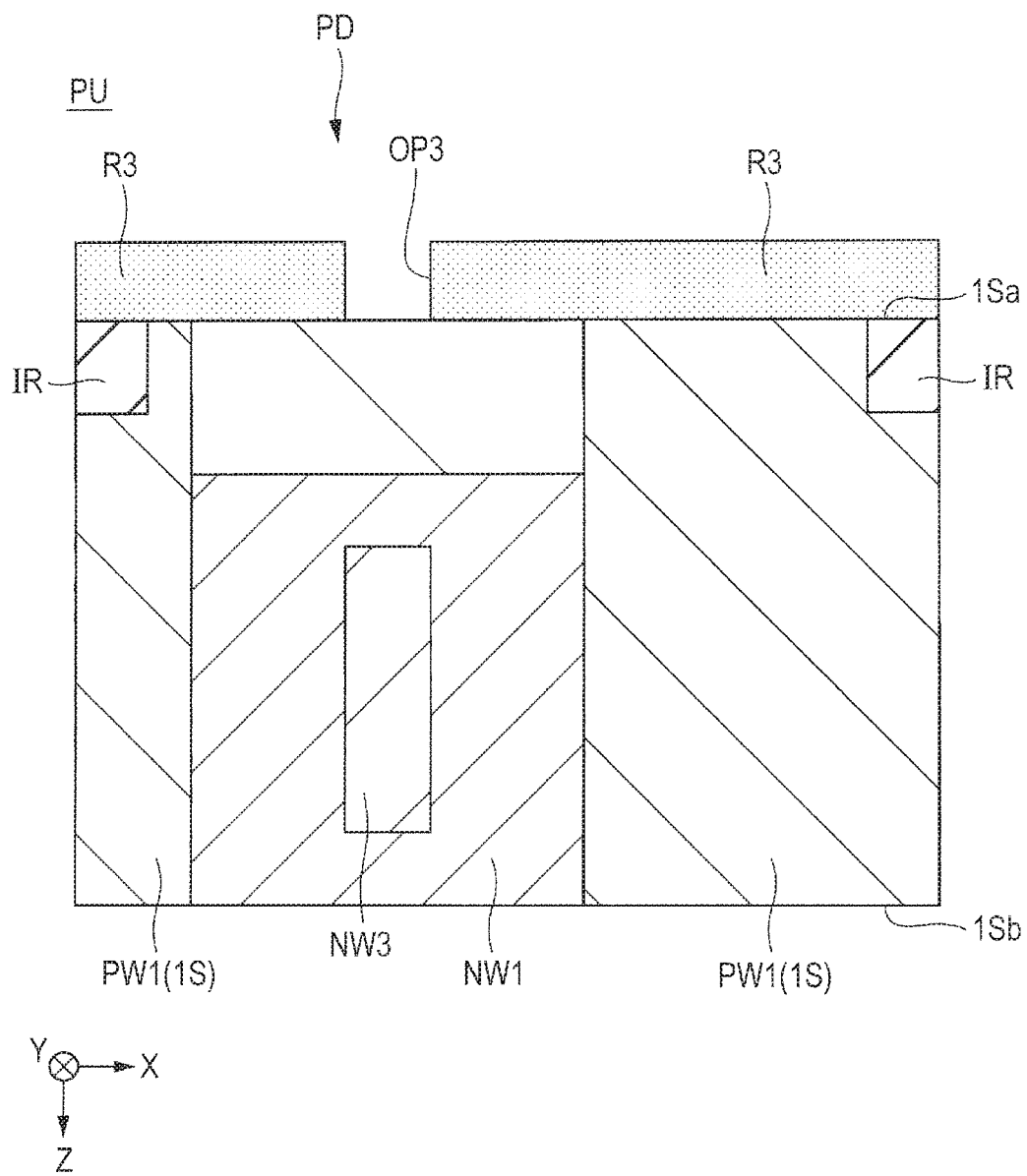
FIG. 11 is a cross sectional view showing the semiconductor device of the embodiment during a manufacturing step.

Then, as shown in FIG. 11, the n type semiconductor region NW3 is formed (Step S4 of FIG. 7). As with the Step S2, using a photolithography technology, a photoresist film R3 having an opening OP3 is formed over the main surface 1Sa of the semiconductor substrate 1S. The photoresist film R3 has the opening OP3 at the central part of the n type semiconductor region NW1 in the X direction. The n type semiconductor region NW3 has a smaller width than that of the n type semiconductor region NW1 in the X direction, and is formed partially at the central part of the n type semiconductor region NW1. Further, in the Z direction, the upper end (the end on the main surface 1Sa side) of the n type semiconductor region NW3 is situated closer to the back surface 1Sb than the upper end (the end on the main surface 1Sa side) of the n type semiconductor region NW1. Further, the lower end (the end on the back surface 1Sb side) of the n type semiconductor region NW3 is situated closer to the main surface 1Sa than the back surface 1Sb, but may extend to the back surface 1Sb.

As described previously, it is important that the impurity density of the n type semiconductor region NW3 is at, for example, about $1 \times 10^{14}$ to $1 \times 10^{15}$ $cm^{-3}$, and lower than the impurity density of the n type semiconductor region NW1. In order to form the n type semiconductor region NW3, in Step S4, boron (B) can be used as the impurity, the implantation energy can be set at, for example, 300 KeV to 1.5 MeV, and the dose amount can be set at, for example, about $3 \times 10^{11}$ to $6 \times 10^{12}$ $cm^{-2}$. In other words, a p type impurity is ion implanted into the n type semiconductor region NW1, thereby to form the n type semiconductor region NW3 having a lower density than that of the n type semiconductor region NW1. Further, while reducing the implantation energy stepwise, ion implantation can be performed by a plurality of divided steps. For example, by three ion implantations of the implantation energy of 900 keV, and the dose amount of about $3\times10^{11}$ cm$^{-2}$ as the implantation conditions for the first stage, the implantation energy of 500 keV, and the dose amount of about $3\times10^{11}$ cm as the implantation conditions for the second stage, and the implantation energy of 300 keV, and the dose amount of about $3\times10^{11}$ cm$^{-2}$ as the implantation conditions for the third stage, the n type semiconductor region NW3 can be formed. As a result, it is possible to precisely control the impurity density distribution of the n type semiconductor region NW3.

In the Step S4, after implanting a p type impurity ion into the semiconductor substrate 1S, and thereby doping the p type impurity, at temperatures as high as, for example, about 1000° C., activation annealing can be performed, thereby to activate the p type impurity doped by ion implantation.

Figure 12:
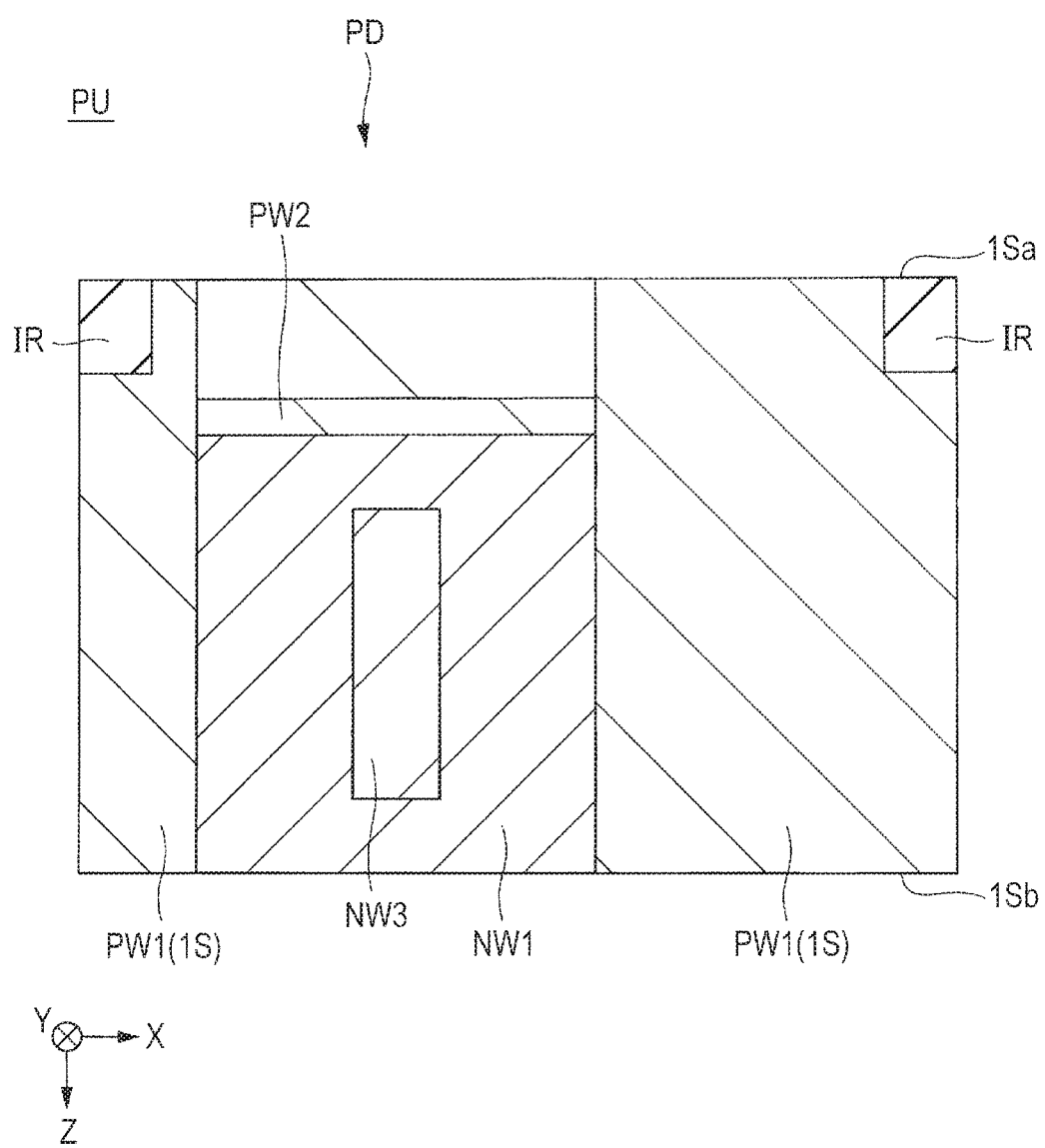
FIG. 12 is a cross sectional view showing the semiconductor device of the embodiment during a manufacturing step.

Then, as shown in FIG. 12, the p type semiconductor region PW2 is formed (Step S5 of FIG. 7). The p type semiconductor region PW2 is situated over the n type semiconductor region NW1. The upper end (the end on the main surface 1Sa side) of the p type semiconductor region PW2 is situated closer to the back surface 1Sb than the main surface 1Sa, and the lower end (the end on the back surface 1Sb side) is in contact with the upper end (the end on the main surface 1Sa side) of the n type semiconductor region NW1. The p type semiconductor region PW2 is formed in the entire region of the pixel PU, but only the region over the n type semiconductor region NW1 is shown.

As described previously, the impurity density of the p type semiconductor region PW2 can be set at, for example, about $1\times10^{15}$ to $1\times10^{16}$ cm$^{-3}$. In order to form the p type semiconductor region PW2, in Step S5, boron (B) can be used as the impurity, the implantation energy can be set at, for example, 50 KeV to 150 KeV, and the dose amount can be set at, for example, about $3\times10^{11}$ to $1\times10^{12}$ cm$^{-2}$.

In the Step S5, after implanting a p type impurity ion into the semiconductor substrate 1S, and thereby doping the p type impurity, at temperatures as high as, for example, about 1000° C., activation annealing can be performed, thereby to activate the p type impurity doped by ion implantation.

Figure 13:
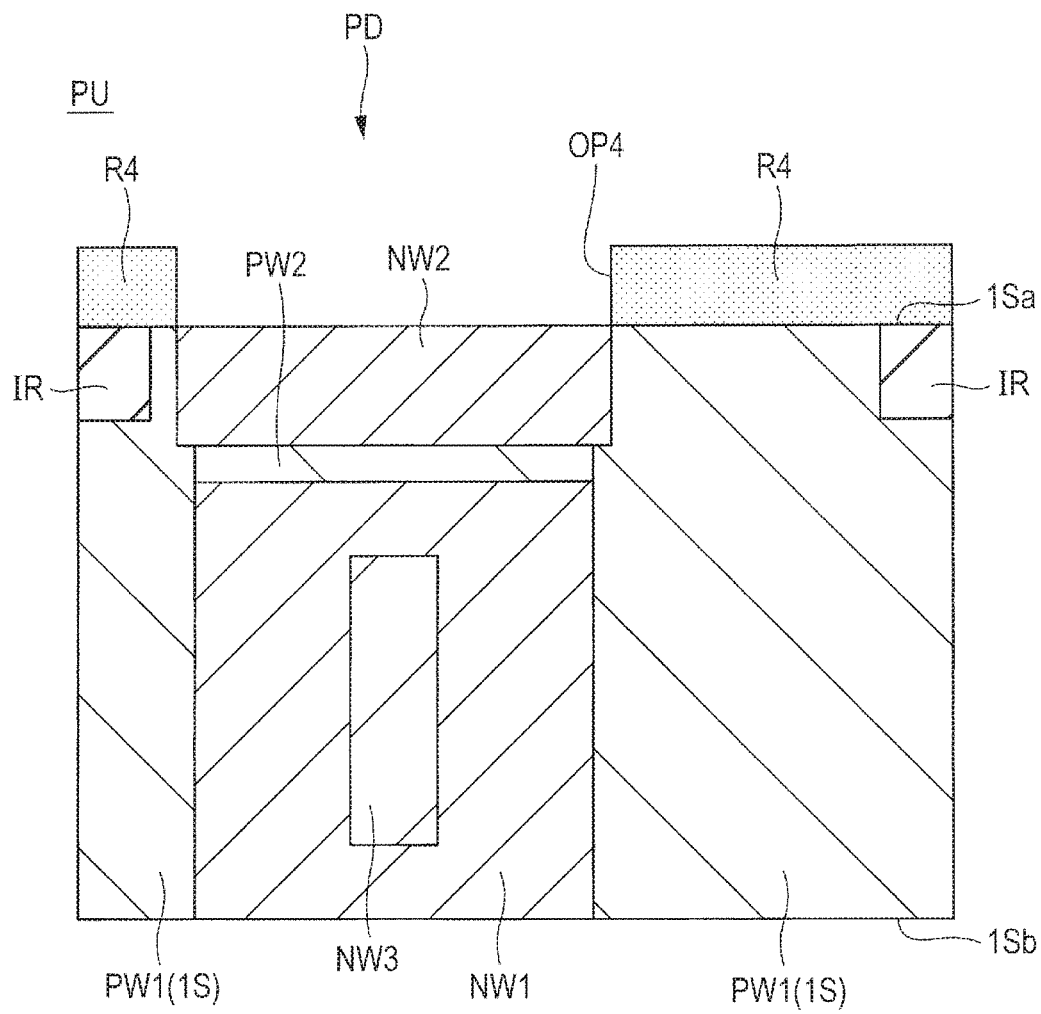
FIG. 13 is a cross sectional view showing the semiconductor device of the embodiment during a manufacturing step.

Then, as shown in FIG. 13, the n type semiconductor region NW2 is formed (Step S6 of FIG. 7). As with the Step S2, using a photolithography technology, a photoresist film R4 having an opening OP4 is formed over the main surface 1Sa of the semiconductor substrate 1S. The photoresist film R4 has the opening OP4 covering the region including the p type semiconductor region PW1 formed therein, and exposing the region including the n type semiconductor region NW1 formed therein. However, the opening OP4 is wider than the opening OP1, and in a plan view, exposes the entire region of the n type semiconductor region NW1, and a part of the p type semiconductor region PW1 situated therearound. The n type semiconductor region NW2 is in contact with the main surface 1Sa of the semiconductor substrate 1S through to the upper end (the end on the main surface 1Sa side) of the p type semiconductor region PW2.

As described previously, the impurity density of the n type semiconductor region NW2 can be set at, for example, about $5\times10^{16}$ to $5\times10^{17}$ cm$^{-3}$. In order to form then type semiconductor region NW2, in Step S5, for example, phosphorus (P) can be used as the impurity, the implantation energy can be set at, for example, 100 KeV to 300 KeV, and the dose amount can be set at, for example, about $3\times10^{11}$ to $6\times10^{12}$ cm$^{-2}$.

In the Step S6, after implanting an n type impurity ion into the semiconductor substrate 1S, and thereby doping the n type impurity, at temperatures as high as, for example, about 1000° C., activation annealing can be performed, thereby to activate the n type impurity doped by ion implantation.

Figure 14:
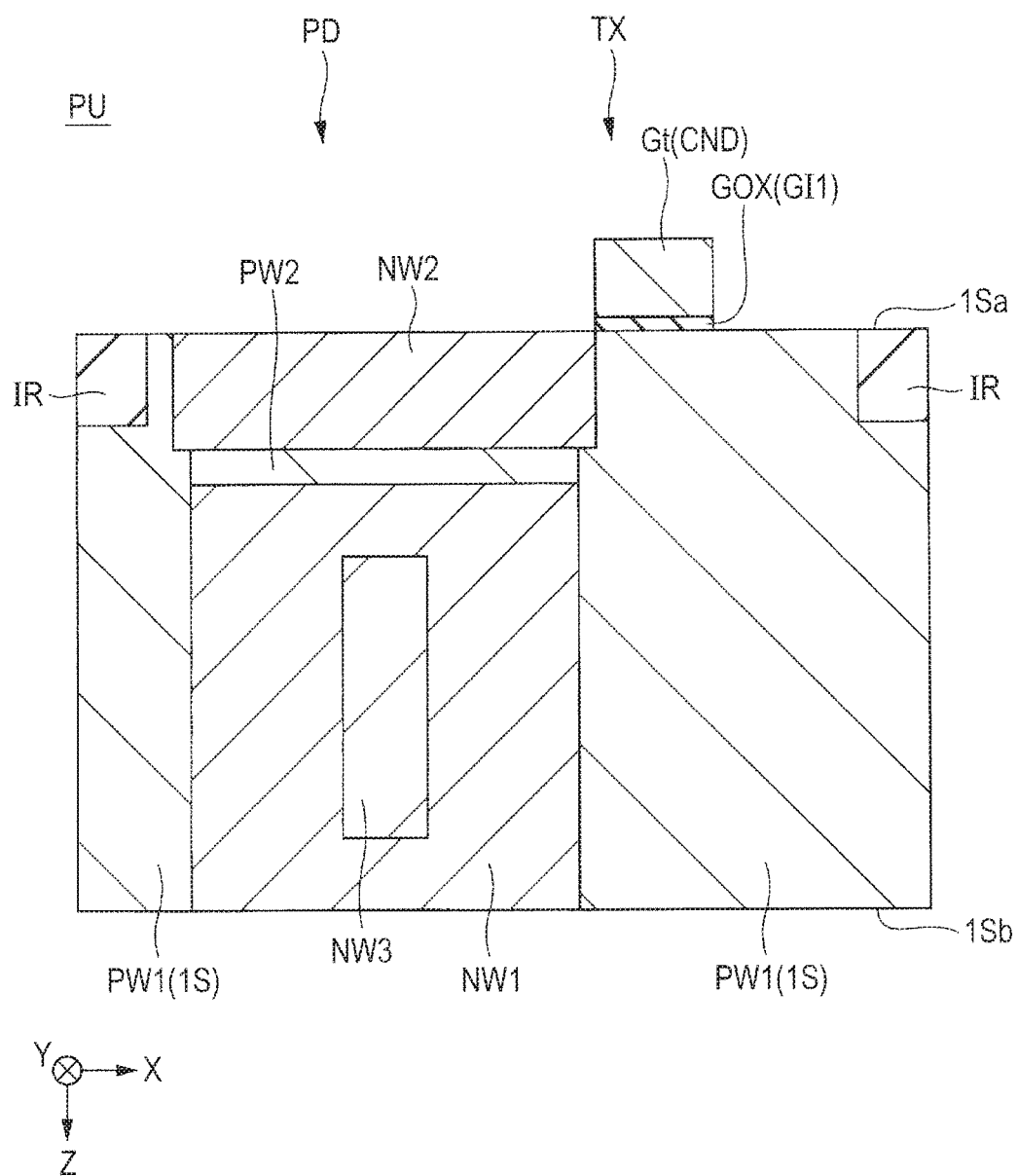
FIG. 14 is a cross sectional view showing the semiconductor device of the embodiment during a manufacturing step.

Then, as shown in FIG. 14, the gate insulation film GOX and the gate electrode Gt are formed (Step S7 of FIG. 7). In the Step S7, the gate electrode Gt is formed over the main surface 1Sa of the semiconductor substrate 1S via the gate insulation film GOX. The gate electrode Gt has a desirable gate length in the X direction, and has a desirable gate width in the Y direction as shown in FIG. 4. The gate insulation film GOX and the gate electrode Gt are situated over the p type semiconductor region PW1. In FIG. 14, in the X direction, the end (the left-hand side of FIG. 14) of the gate electrode Gt matches the end (the right-hand side of FIG. 4) of the n type semiconductor region NW2. However, the gate electrode Gt and the n type semiconductor region NW2 may have an overlap in the X direction.

In the Step S7, first, the semiconductor substrate 1S is thermally oxidized, thereby to form an insulation film GI1 formed of a silicon oxide film over the main surface 1Sa of the p type semiconductor region PW1.

As the insulation film GI1, a silicon nitride film, a silicon oxynitride (SiON) film, or the like may be used. Alternatively, a so-called high dielectric constant film such as a hafnium type insulation film obtained by doping a hafnium oxide (HfO$_2$) film with lanthanum oxide, namely, a film having a higher dielectric constant than that of a silicon nitride film may be used. The films can be formed using, for example, a CVD (Chemical Vapor Deposition) method.

In the Step S7, then, over the insulation film GI1, for example, a polycrystal silicon film is formed as a conductive film CND using a CVD method, or the like.

In the Step S7, then, the conductive film CND and the insulation film GI1 are patterned. Specifically, over the conductive film CND, a photoresist film (not shown) is formed. Using a photolithography technology, exposure and development treatments are performed. As a result, the photoresist film is left in the gate electrode Gt forming region. Then, using the resist film as a mask, the conductive film CND and the insulation film GI1 are etched. This results in the formation of a gate electrode Gt including the conductive film CND over the p type semiconductor region PW1 via the gate insulation film GOX including the insulation film GI1. Then, the photoresist film is removed by asking or the like.

At this step, the gate electrode of the transistor as the logic transistor to be formed in the peripheral circuit region may be formed over the semiconductor substrate 1S via the gate insulation film. Alternatively, for example, other transistors shown in FIG. 2, namely, the gate electrode Gr, the gate electrode Gs, and the gate electrode Ga of the reset transistor RST, the selection transistor SEL, and the amplification transistor AMI may be formed.

Figure 15:
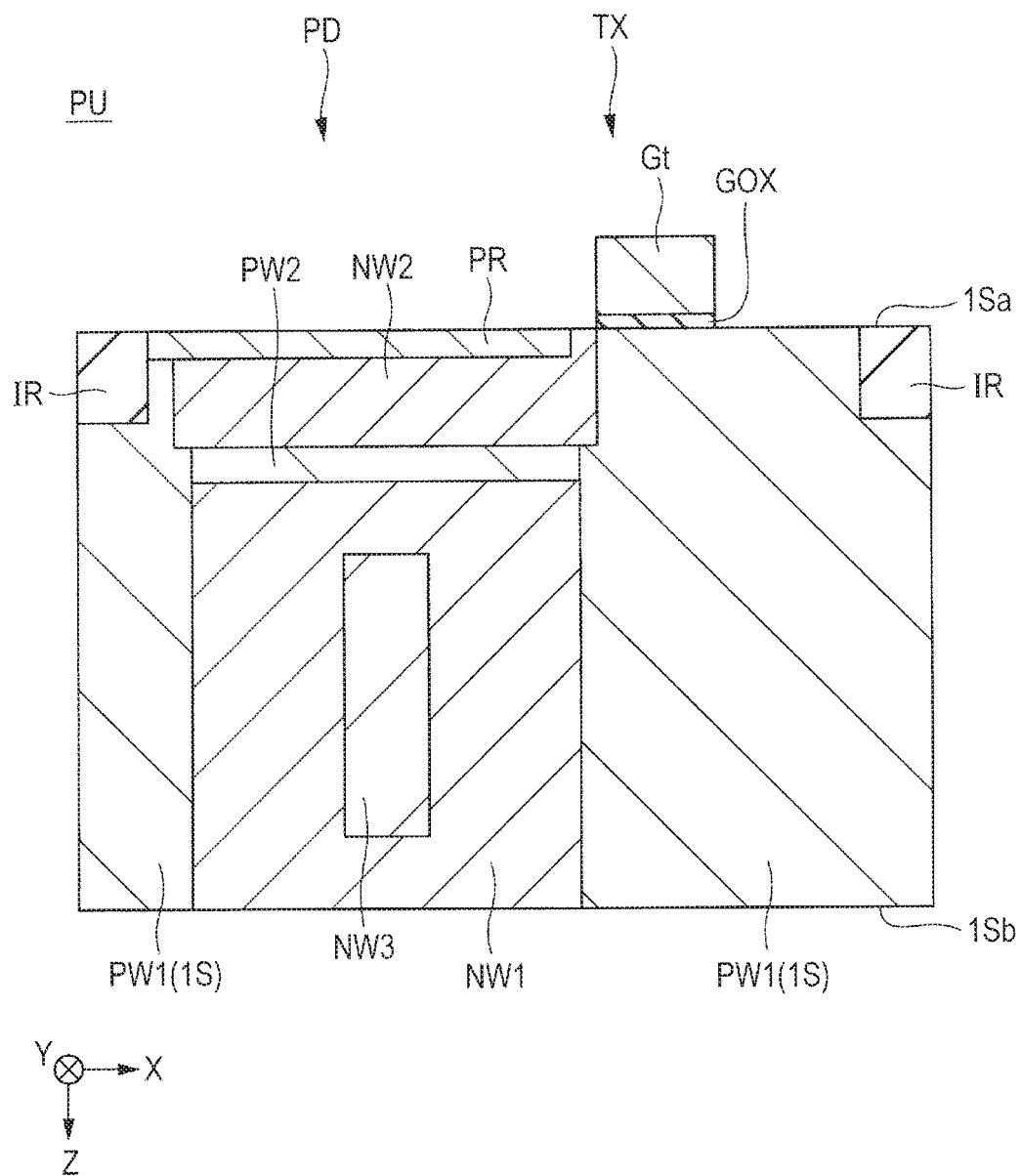
FIG. 15 is a cross sectional view showing the semiconductor device of the embodiment during a manufacturing step.

Then, as shown in FIG. 15, the p type semiconductor region PR is formed (Step S8 of FIG. 7). In the Step S8, for example, using a photolithography technology and an ion implantation method, a p type impurity ion such as boron (B) is ion implanted into the main surface 1Sa side of the n type semiconductor region NW. As a result, as shown in FIG. 15, the p type semiconductor region PR is formed on the main surface 1Sa side of the n type semiconductor region NW2.

The p type impurity density in the p type semiconductor region PR can be set at, for example, about $1 \times 10^{18}$ to $1 \times 10^{19}$ cm$^{-3}$. Further, in Step S8, as the implantation conditions for ion implanting, for example, boron (B) as the p type impurity, the implantation energy can be set at, for example, 10 KeV or less, and the dose amount can be set at, for example, about $1 \times 10^{12}$ to $3 \times 10^{13}$ cm$^{-2}$. Incidentally, the direction in which ion is implanted is tilted by, for example, 20 to 30° with respect to the direction perpendicular to the main surface 1Sa. As a result, the p type semiconductor region PR can be separated from the gate electrode Gt in a plan view. Further, for example, while increasing the tilt angle stepwise, ion implantation can be performed by a plurality of divided steps. As a result, the p type semiconductor region PR can be separated from the gate electrode Gt with a high positional precision.

Incidentally, although not shown, for example, after performing Step S8, and before performing Step S9, in order to adjust the threshold voltage of the transistor to be formed in the peripheral circuit region, in the opposite portions of the well region formed in the peripheral circuit region across the gate electrode, extension regions, namely, n type low density semiconductor regions may be formed in alignment with the gate electrode. Further, in the well region formed in the peripheral circuit region, halo regions may be formed in such a manner as to surround the low density semiconductor region at the portions on the opposite sides of the well region formed in the peripheral circuit region across the gate electrode in order to prevent or suppress the short channel effect of the transistor to be formed in the peripheral circuit region.

Alternatively, for example, respective extension regions, namely, respective n type low density semiconductor regions of other transistors shown in FIG. 2, namely, the reset transistor RST, the selection transistor SEL, and the amplification transistor AMI may be formed in alignment with the gate electrodes of their respective transistors, respectively. Whereas, the n type low density semiconductor region may be formed in alignment with the gate electrode Gt in the p type semiconductor region PW1.

Figure 16:
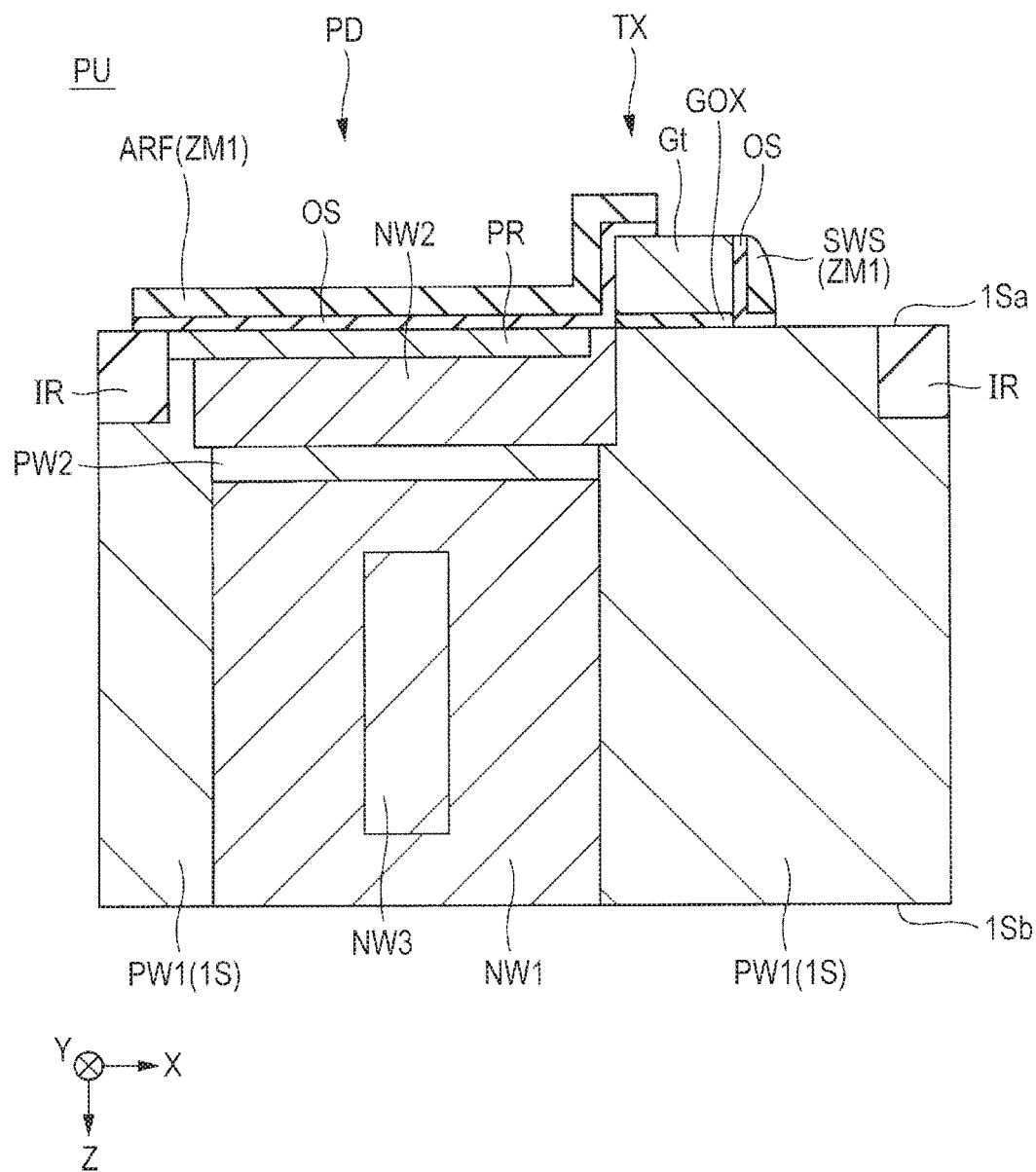
FIG. 16 is a cross sectional view showing the semiconductor device of the embodiment during a manufacturing step.

Then, as shown in FIG. 16, an antireflection film ARF and a sidewall spacer SWS are formed (Step S9 of FIG. 7).

In the Step S9, first, an offset spacer OS is formed in such a manner as to cover the gate electrode Gt. The offset spacer OS is formed of, for example, a silicon oxide film.

In the Step S9, then, over the main surface 1Sa of the semiconductor substrate 1S, an insulation film ZM1 is formed in such a manner as to cover the gate electrode Gt and the offset spacer OS. The insulation film ZM1 also serves as the insulation film for forming the antireflection film ARF, and the insulation film for forming the sidewall spacer SWS. The insulation film ZM1 is formed of, for example, a silicon nitride film.

In the Step S9, then, over the insulation film ZM1 in the antireflection film ARF forming region, a photoresist pattern (not shown) is formed. The n type semiconductor region NW2 and the p type semiconductor region PR arranged closer to the source than the gate electrode Gt are covered with the photoresist pattern not shown. On the other hand, the portion of the p type semiconductor region PW1 situated closer to the drain than the gate electrode Gt in a plan view is exposed from the photoresist pattern not shown.

In the Step S9, then, using the photoresist pattern not shown as a mask (etching mask), the insulation film ZM1 is etched back by anisotropic dry etching such as a RIE (Reactive Ion Etching) method. At this step, over the sidewall of the gate electrode Gt, the insulation film ZM1 is left, thereby to form the sidewall spacer SWS. Thus, under the photoresist pattern not shown, the insulation film ZM1 is left, thereby to form the antireflection film ARF. After anisotropic dry etching, the photoresist pattern is removed.

The antireflection film ARF is formed over each of the n type semiconductor region NW2 and the p type semiconductor region PR via the offset spacer OS. Respective parts (ends) of the antireflection film ARF and the offset spacer OS extend over the gate electrode Gt. For this reason, the sidewall on the source side, namely, the photodiode PD side of the gate electrode Gt of the opposite sidewalls of the gate electrode Gt is covered with the antireflection film ARF via the offset spacer OS.

On the other side, over the sidewall on the drain side, namely, the side on which the floating diffusion FD is formed of the opposite sidewalls of the gate electrode Gt, the sidewall spacer SWS is formed via the offset spacer OS.

Incidentally, for performing Step S9, sidewall spacers may be formed over the opposite sidewalls of the gate electrode of the transistor formed in the peripheral circuit region via the offset spacers. Alternatively, for example, sidewall spacers may be formed over respective opposite sidewalls of respective gate electrodes of other transistors shown in FIG. 2, namely, the reset transistor RST, the selection transistor SEL, and the amplification transistor AMI via respective offset spacers, respectively.

Figure 17:
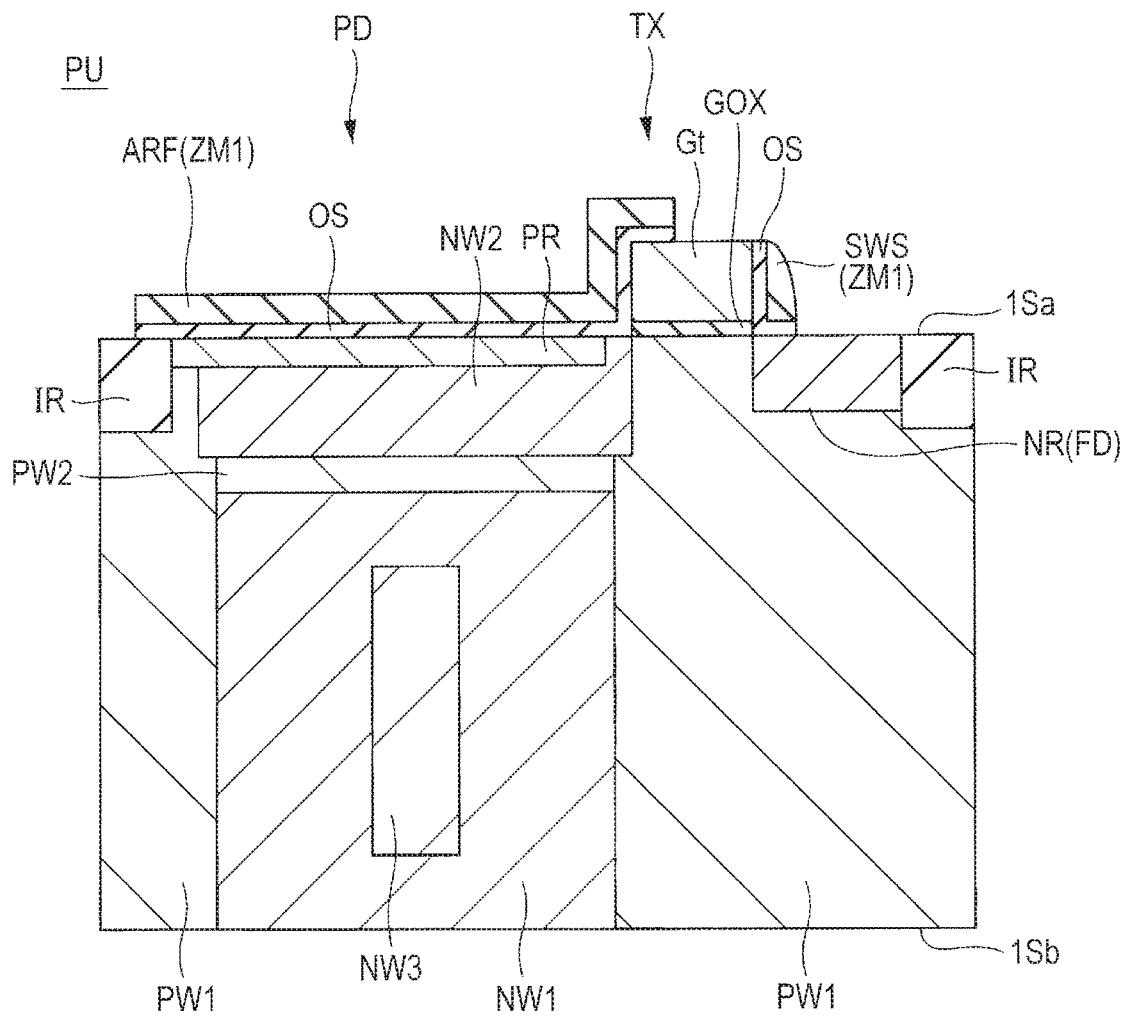
FIG. 17 is a cross sectional view showing the semiconductor device of the embodiment during a manufacturing step.

Then, as shown in FIG. 17, the n type semiconductor region NR is formed (Step S10 of FIG. 7).

In the Step S10, an n type impurity ion such as phosphorus (P) or arsenic (As) is ion implanted into the portion of the p type semiconductor region PW1 situated closer to the drain than the gate electrode Gt, namely, opposite to the photodiode PD across the gate electrode Gt (the right-hand side of FIG. 17) using the antireflection film ARF and the gate electrode Gt as a mask. As a result, an n type semiconductor region NR is formed at the portion of the p type semiconductor region PW1 situated opposite to the n type semiconductor region NW1 across the gate electrode Gt. The n type semiconductor region NR is also the drain region of the transfer transistor TX, and is also the semiconductor region serving as the floating diffusion FD of the photodiode PD. The n type impurity density in the n type semiconductor region NR is higher than the n type impurity density in the n type semiconductor region NW2.

As the implantation conditions for ion implanting, for example, phosphorus (P) and arsenic (As) as the n type impurity, the implantation energy can be set at, for example, about 60 keV or less, and the dose amount can be set at, for example, about $1 \times 10^{13}$ to $3 \times 10^{15}$ cm$^{-2}$. Further, for example, while reducing the implantation energy stepwise, and changing the kind of the n type impurity to be ion implanted from phosphorus to arsenic, ion implantation can be performed in a plurality of divided steps. As a result, the impurity can be sequentially ion implanted while precisely controlling the impurity density of the portion from the side more distant from the main surface 1Sa to the side closer to the main surface 1Sa of the p type semiconductor region PW1.

As described previously, when the n type low density semiconductor region is formed in alignment with the gate electrode Gt in the p type semiconductor region PW1, the n type low density semiconductor region and the n type semiconductor region NR form the floating diffusion FD having a LDD (Lightly Doped Drain) structure.

By the steps up to this point, the photodiode PD and the transfer transistor TX are formed at the main surface 1Sa of the semiconductor substrate 1S. The gate electrode Gt and the n type semiconductor region NR form the transfer transistor TX. Further, the n type semiconductor region NW2 and the n type semiconductor region NR are arranged at the opposite ends of the gate electrode Gt across the gate electrode Gt. The transfer transistor TX has the gate electrode Gt, the n type semiconductor region NW2 functioning as the source, and the n type semiconductor region NR functioning as the drain.

Incidentally, although not shown, for performing the Step S10, an n type high density semiconductor region may be formed in alignment with the sidewall spacer formed over the sidewall of the gate electrode in the well region formed in the peripheral circuit region. Then, the n type low density semiconductor region and the n type high density semiconductor region may form source/drain regions having a LDD structure. As a result, a transistor is formed in the peripheral circuit region.

Alternatively, for forming the Step S10, the n type high density semiconductor region included in each of, for example, other transistors shown in FIG. 2, namely, the reset transistor RST, the selection transistor SEL, and the amplification transistor AMI may be formed in alignment with the sidewall spacer formed over the sidewall of the gate electrode of each transistor. Then, the n type low density semiconductor region and the n type high density semiconductor region may form source/drain regions having a LDD structure. As a result, for example, other transistors shown in FIG. 2, namely, the reset transistor RST, the selection transistor SEL, and the amplification transistor AMI are formed.

Incidentally, after performing Step S10, and before performing Step S11, in the peripheral circuit region, a silicide layer may be formed over each of the n type high density semiconductor region and the gate electrode. Alternatively, a silicide layer may also be formed over the floating diffusion FD.

Figure 18:
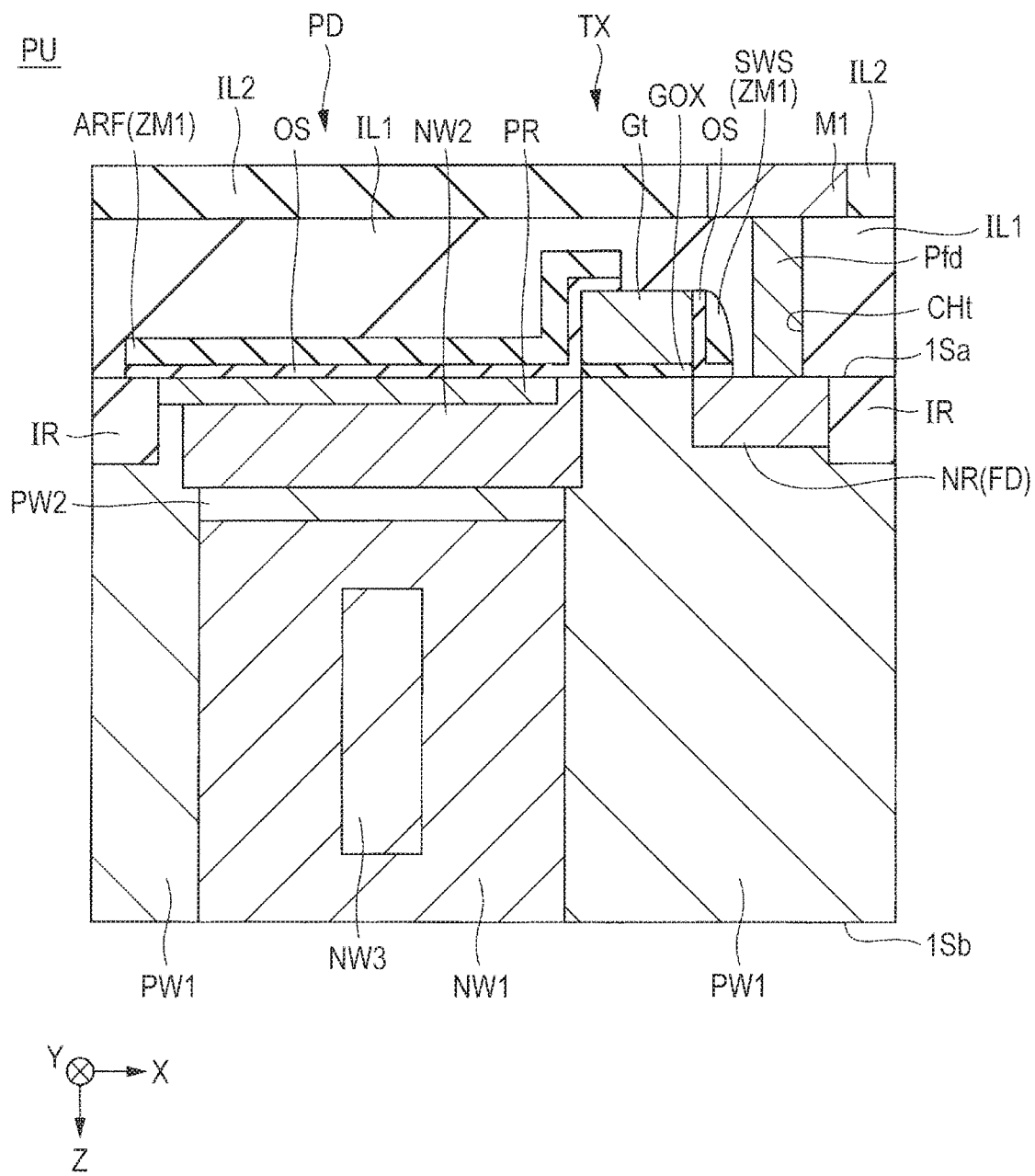
FIG. 18 is a cross sectional view showing the semiconductor device of the embodiment during a manufacturing step.

Then, as shown in FIG. 18, an interlayer insulation film IL1 and a plug (plug electrode) Pfd is formed (Step S11 of FIG. 7).

In the Step S11, first, over the surface of the semiconductor substrate 1S, the interlayer insulation film IL1 is formed via the offset spacer OS, the antireflection film ARF, and the sidewall spacer SWS in such a manner as to cover the photodiode PD and the transfer transistor TX.

For example, over the semiconductor substrate 1S, by a CVD method using a TEOS gas as a raw material gas, a silicon oxide film is deposited. Thereafter, if required, the surface of the interlayer insulation film IL1 is planarized using a CMP (Chemical Mechanical Polishing) method, or the like.

Although not shown, at this step, in the peripheral circuit region, over the main surface 1Sa of the semiconductor substrate 1S, an interlayer insulation film may be formed in such a manner as to cover a transistor. Further, at this step, in the pixel region 1A, over the main surface 1Sa of the semiconductor substrate 1S, an interlayer insulation film may be formed in such a manner as to cover, for example, other transistors shown in FIG. 2, namely, the reset transistor RST, the selection transistor SEL, and the amplification transistor AMI.

In the Step S11, then, the interlayer insulation film IL1 is patterned, thereby to form a contact hole CHt. Over the n type semiconductor region NR as the floating diffusion FD and the drain region of the transfer transistor TX, a contact hole CHt penetrating through the interlayer insulation film IL1, and reaching the n type semiconductor region NR is formed.

Although not shown, at this step, a contact hole may be formed over each of the gate electrode and source/drain regions of the transistor in the peripheral circuit region. Further, in the pixel region 1A, a contact hole may be formed over each of the gate electrode Gr, the gate electrode Gs, and the gate electrode Ga, and the source/drain regions of, for example, other transistors shown in FIG. 2, namely, the reset transistor RST, the selection transistor SEL, and the amplification transistor AMI. Alternatively, in the pixel region 1A, a contact hole may be formed over the gate electrode Gt of the transfer transistor TX.

In the Step S11, then, over the interlayer insulation film IL1 including the bottom surface and the side surface of the contact hole CHt, a titanium/titanium nitride film is formed. The titanium/titanium nitride film is formed of a lamination film of a titanium film and a titanium nitride film over the titanium film, and can be formed using, for example, a sputtering method. The titanium/titanium nitride film has a so-called diffusion barrier property of preventing diffusion of, for example, tungsten of a material for a film to be embedded in a later step into silicon.

Then, a tungsten film is formed at the entire main surface 1Sa of the semiconductor substrate 1S in such a manner as to fill the contact hole CHt. The tungsten film can be formed using, for example, a CVD method. Then, the unnecessary portions of the titanium/titanium nitride film and the tungsten film formed over the interlayer insulation film IL1 are removed by, for example, a CMP method. As a result, the plug Pfd can be formed.

Although not shown, at this step, the plug may be formed over each of the gate electrode and the source/drain regions of the transistor in the peripheral circuit region. Further, in the pixel region 1A, the plug may be formed over each of the gate electrode Gr, the gate electrode Gs, and the gate electrode Ga, and the source/drain regions of, for example, other transistors shown in FIG. 2, namely, the reset transistor RST, the selection transistor SEL, and the amplification transistor AMI. Alternatively, in the pixel region 1A, the plug may be formed over the gate electrode Gt of the transfer transistor TX.

Then, as shown in FIG. 18, an interlayer insulation film IL2 and a wire M1 are formed (Step S12 of FIG. 7).

In the Step S12, first, over the interlayer insulation film IL1, a lamination film of a silicon nitride film and a silicon oxide film thereover is formed as the interlayer insulation film IL2 by a CVD method or the like. Then, the lamination film is patterned, thereby to form a wire trench.

In the Step S12, then, over the interlayer insulation film IL2 including the inside of the wire trench, a lamination film of a tantalum (Ta) film and a tantalum nitride (TaN) film thereover is deposited as a barrier film by a sputtering method or the like. Then, over the barrier film, a thin copper film is deposited as a seed film (not shown) by a sputtering method or the like, and a copper film is deposited over the seed film by an electrolytic plating method. Then, the unnecessary portions of the barrier film, the seed film, and the copper film over the interlayer insulation film IL2 are removed by a CMP method or the like. Thus, by embedding the barrier film, the seed film, and the copper film in the inside of the wire trench, the wire M1 can be formed (single damascene method). Incidentally, FIG. 18 shows the wire M1 including the barrier film, the seed film, and the copper film in an integral form.

In FIG. 18, only the first-layer wire M1 is shown. However, as with the formation of the interlayer insulation film IL2 and the wire M1, wires up to nth-layer wire may be sequentially formed (where n=2, 3, or the like).

Figure 19:
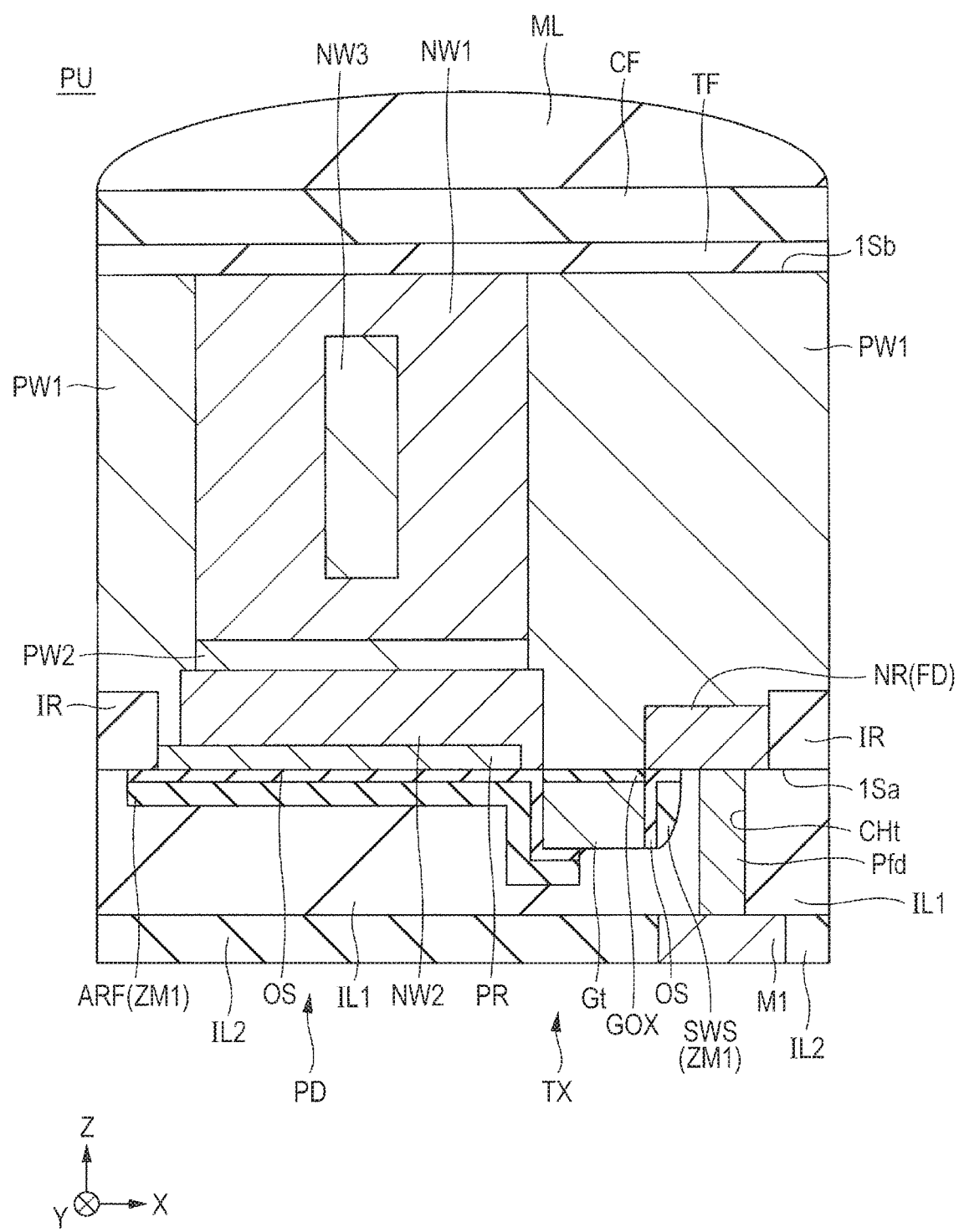
FIG. 19 is a cross sectional view showing the semiconductor device of the embodiment during a manufacturing step.

Then, as shown in FIG. 19, a transmission film TF, a color filter layer CF, and a microlens ML are formed (Step S13 of FIG. 7).

In the Step S13, first, the main surface 1Sa side of the semiconductor substrate 1S is bonded to a support substrate not shown. The back surface 1Sb is polished, thereby to make the semiconductor substrate 1S thin. As a result, as shown in FIG. 19, the n type semiconductor layer NW1 is exposed at the back surface 1Sb.

Then, the transmission film TF is bonded onto the back surface 1Sb, and the color filter layer CF and the microlens ML are sequentially bonded. Herein, the transmission film TF is formed of an inorganic insulation film such as hafnium oxide (HfO), aluminum oxide (AlO), or zirconium oxide (ZrO). Whereas, the color filter layer CF is a film for transmitting a light of a specific color such as red (R), green (G), or blue (B) therethrough, and not transmitting lights of other colors. Further, the microlens ML is arranged at a position overlapping the photodiode PD in a plan view.

By the steps up to this point, it is possible to manufacture the semiconductor device of the present embodiment including the back-surface irradiation type CMOS image sensor.

Modified Example 1

Figure 20:
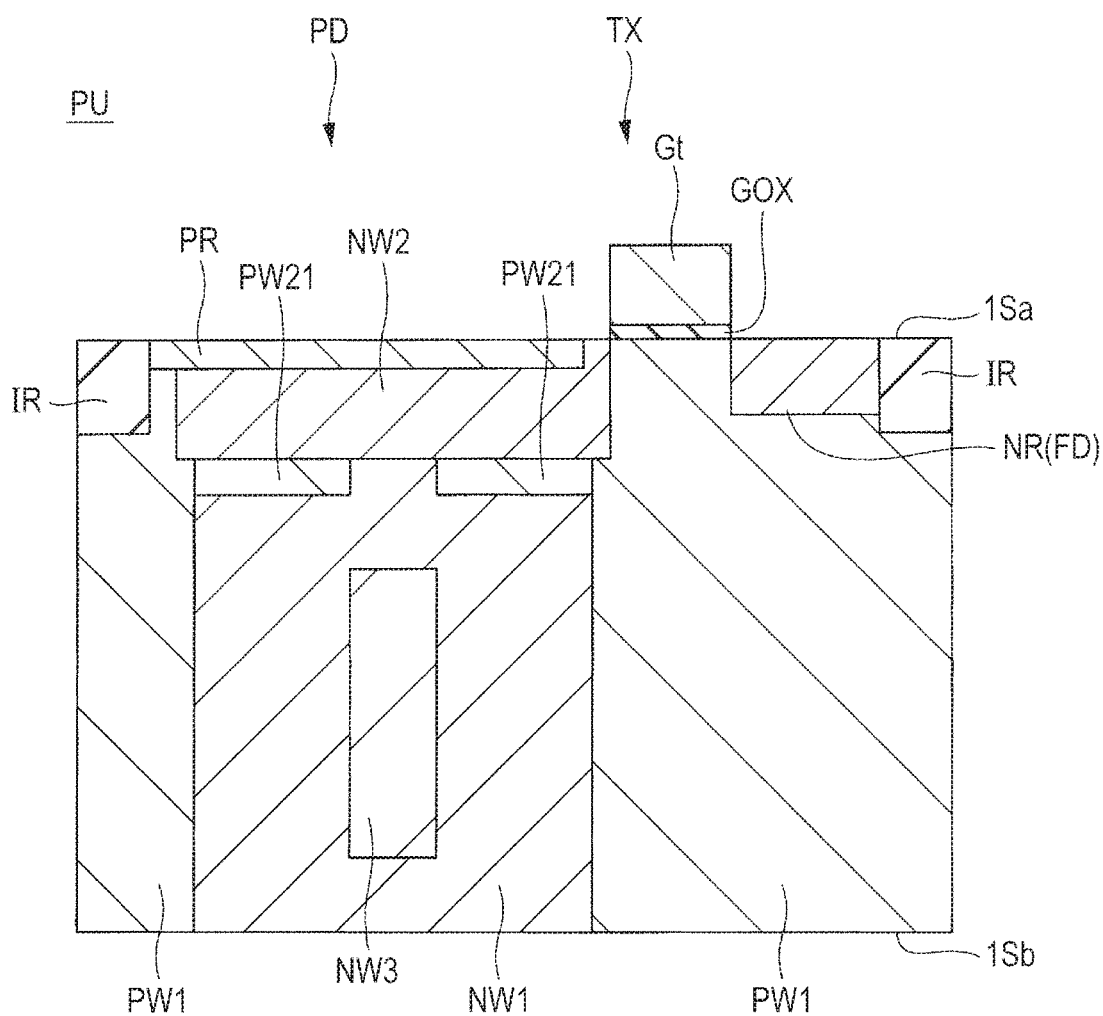
FIG. 20 is a cross sectional view showing a configuration of a semiconductor device of Modified Example 1.
Figure 21:
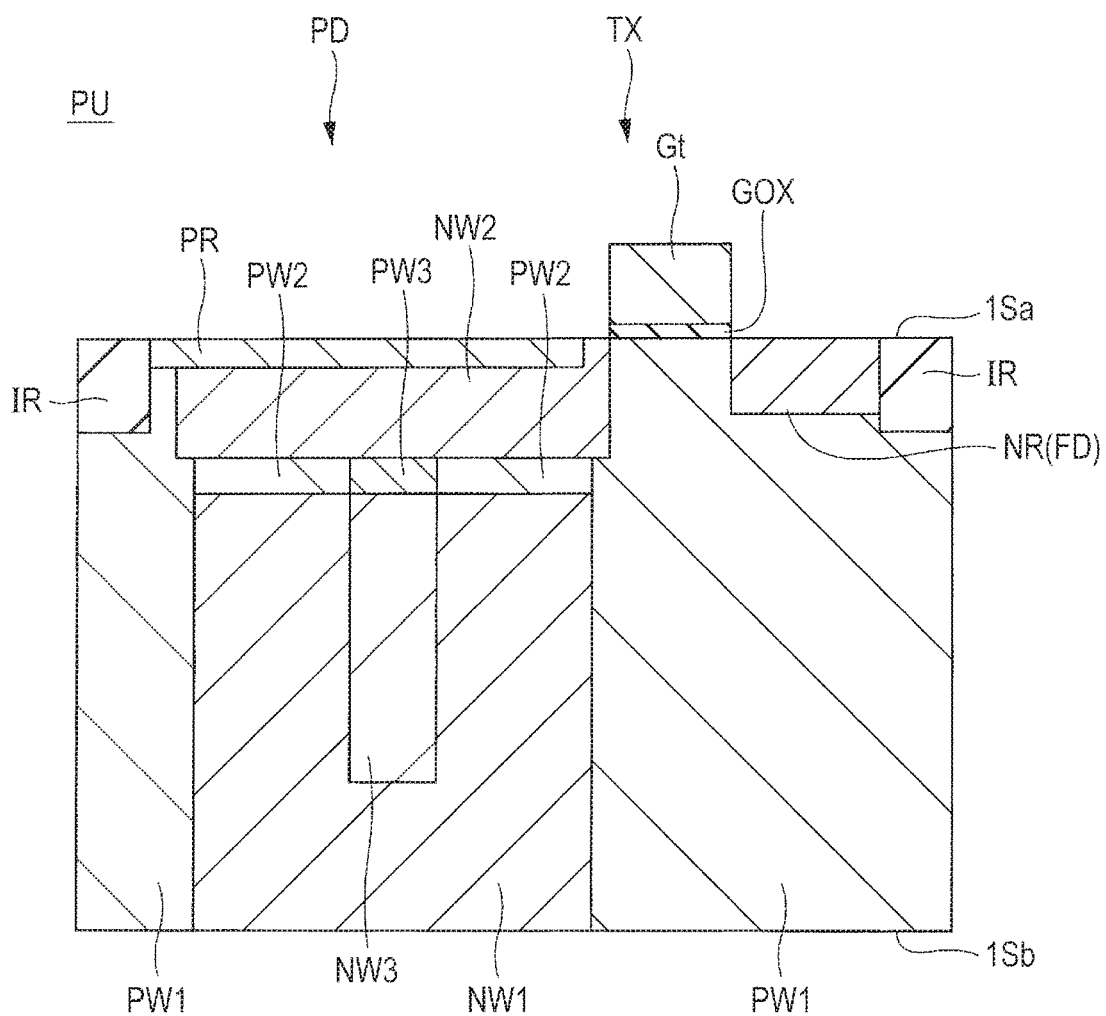
FIG. 21 is a cross sectional view showing a configuration of a semiconductor device of Comparative Example.

FIG. 20 is a cross sectional view showing a configuration of a semiconductor device of Modified Example 1. FIG. 21 is a cross sectional view showing a configuration of a semiconductor device of Comparative Example. FIG. 21 is a potential block view at the time of charge transfer of the semiconductor device of Comparative Example.

FIG. 20 is Modified Example of FIG. 5 of the embodiment. In FIG. 5, the p type semiconductor region PW2 is continuously interposed between the n type semiconductor regions NW1 and NW2. In other words, the p type semiconductor region PW2 is also formed over the n type semiconductor region NW3. In contrast, in Modified Example 1, the p type semiconductor region PW21 corresponding to the p type semiconductor region PW2 of FIG. 5 is divided (separated) into two parts over the n type semiconductor region NW3 as shown in FIG. 20. The p type semiconductor region PW21 is not present between the n type semiconductor regions NW2 and NW3 over the n type semiconductor region NW3. In other words, in the X direction, at the opposite ends of the n type semiconductor region NW3, the p type semiconductor region PW21 is interposed between the n type semiconductor regions NW1 and NW2. However, over the n type semiconductor region NW3, the p type semiconductor region PW21 is not interposed between the n type semiconductor region NW3 and the n type semiconductor region NW2.

Figure 22:
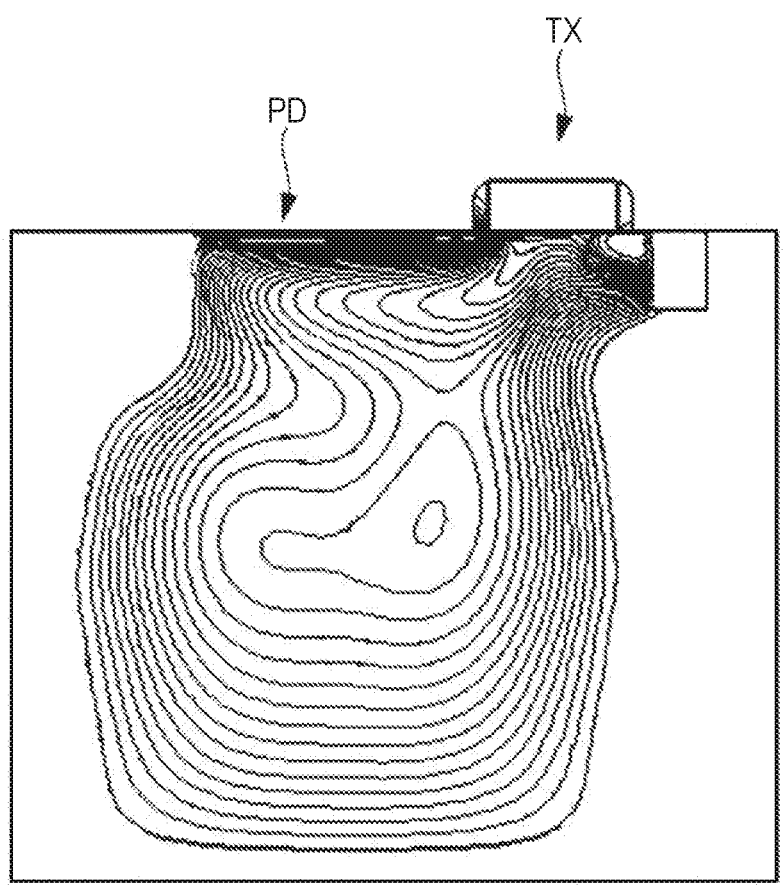
FIG. 22 is a potential block view at the time of charge transfer of the semiconductor device of Comparative Example.

In the semiconductor device of Comparative Example shown in FIG. 21, the p type semiconductor region PW3 is formed in the region in which the p type semiconductor region PW2 and the n type semiconductor region NW3 overlap each other. The p type semiconductor region PW3 is the region having a higher impurity density than that of the p type semiconductor region PW2. This is because the p type semiconductor region PW3 is the region doped with the p type impurity for forming the p type semiconductor region PW2 and the p type impurity for forming the n type semiconductor region NW3. As shown in FIG. 22, the presence of the p type semiconductor region PW3 having a relatively higher density generates the potential barrier between the lower part and the upper part of the photodiode PD. This entails a fear that a charge transfer residue is caused in the n type semiconductor region NW1.

With the configuration of Modified Example 1, the p type semiconductor region PW21 is divided, and the p type semiconductor region PW21 is not formed over the n type semiconductor region NW3. For this reason, the p type semiconductor region PW3 of Comparative Example is not formed, and a potential barrier is not caused between the lower part and the upper part of the photodiode PD. Therefore, it is possible to prevent the generation of a charge transfer residue in the n type semiconductor region NW1, which can improve the charge transfer efficiency.

Modified Example 2

Figure 23:
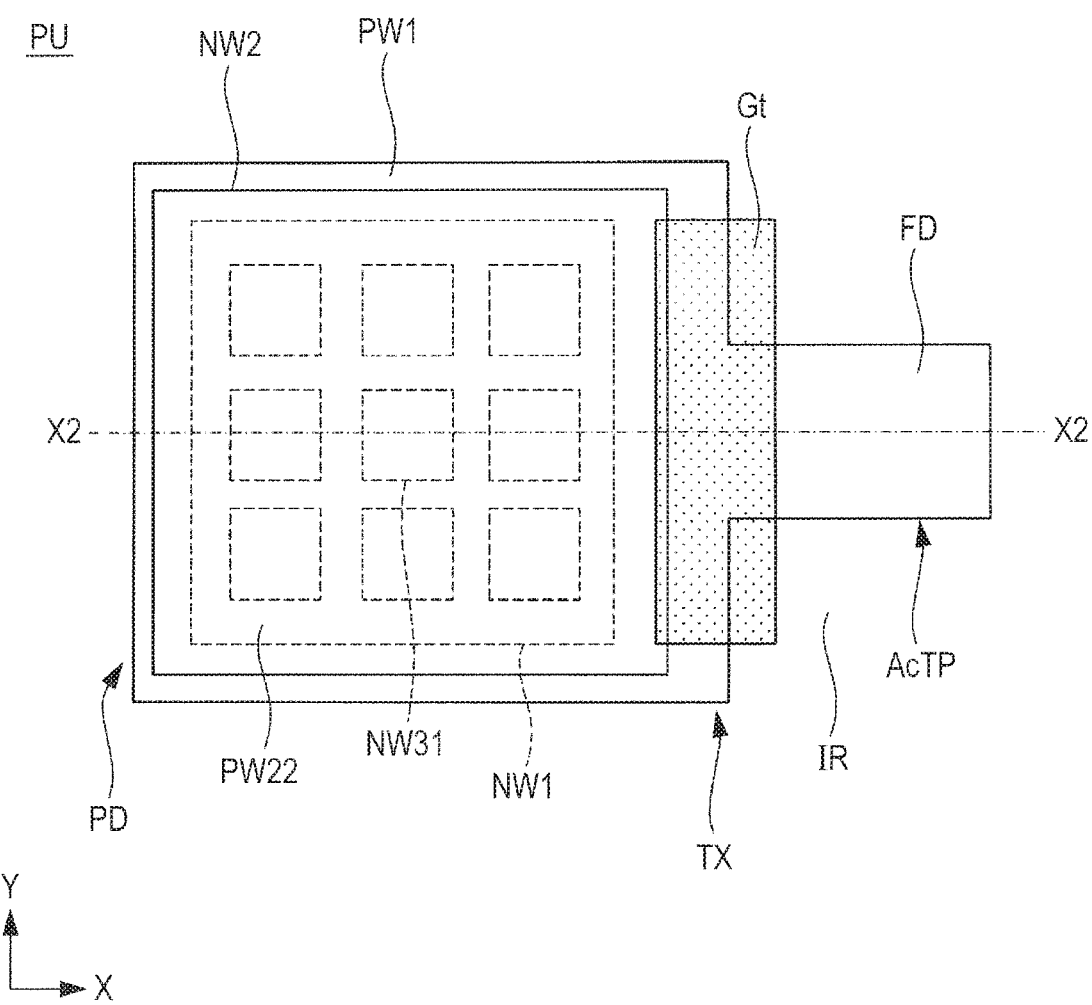
FIG. 23 is a plan view showing a configuration of a semiconductor device of Modified Example 2.
Figure 24:
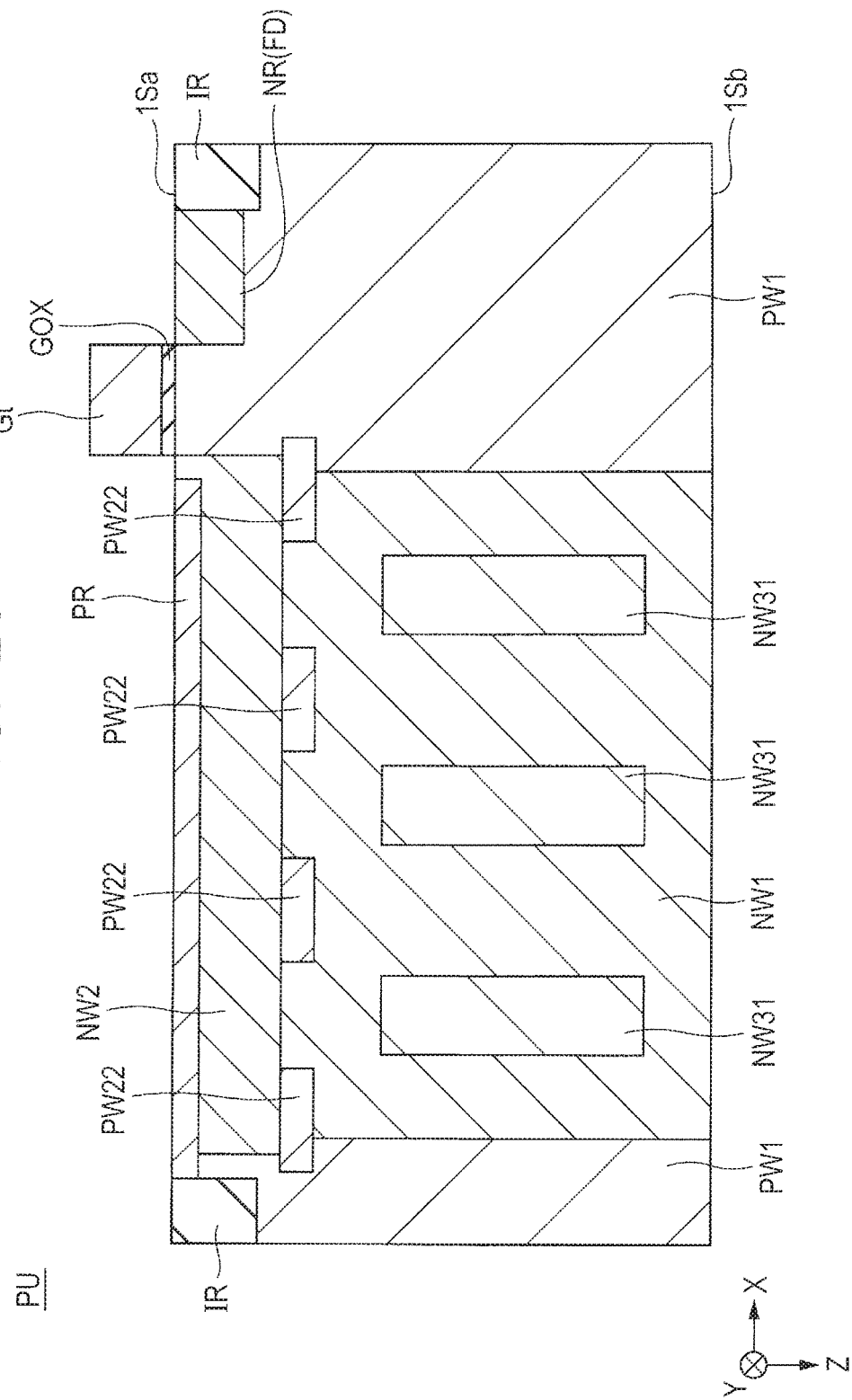
FIG. 24 is a cross sectional view along X2-X2 of FIG. 23.

Modified Example 2 is Modified Example of FIG. 5 of the embodiment, and is also Modified Example of Modified Example 1. FIG. 23 is a plan view showing a configuration of a carrier device of Modified Example 2. FIG. 24 is a cross sectional view along X2-X2 of FIG. 23.

FIG. 5 shows an example in which one n type semiconductor region NW3 is provided in the n type semiconductor region NW1. However, in Modified Example 2, a plurality of n type semiconductor regions NW31 are arranged in the n type semiconductor region NW1. The n type semiconductor region NW31 corresponds to the n type semiconductor region NW3 of FIG. 5. Further, as shown in FIG. 23, a plurality of n type semiconductor regions NW31 are arranged equally in the X direction and the Y direction, respectively. Further, as with Modified Example 1, the p type semiconductor region PW22 corresponding to the p type semiconductor region PW2 of FIG. 5 is divided (separated) over the n type semiconductor region NW3.

A plurality of n type semiconductor regions NW31 are arranged in the n type semiconductor region NW1. As a result, it is possible to improve the charge transfer efficiency even when the width of the n type semiconductor region NW1 is expanded in the X direction and the Y direction.

Modified Example 3

Figure 25:
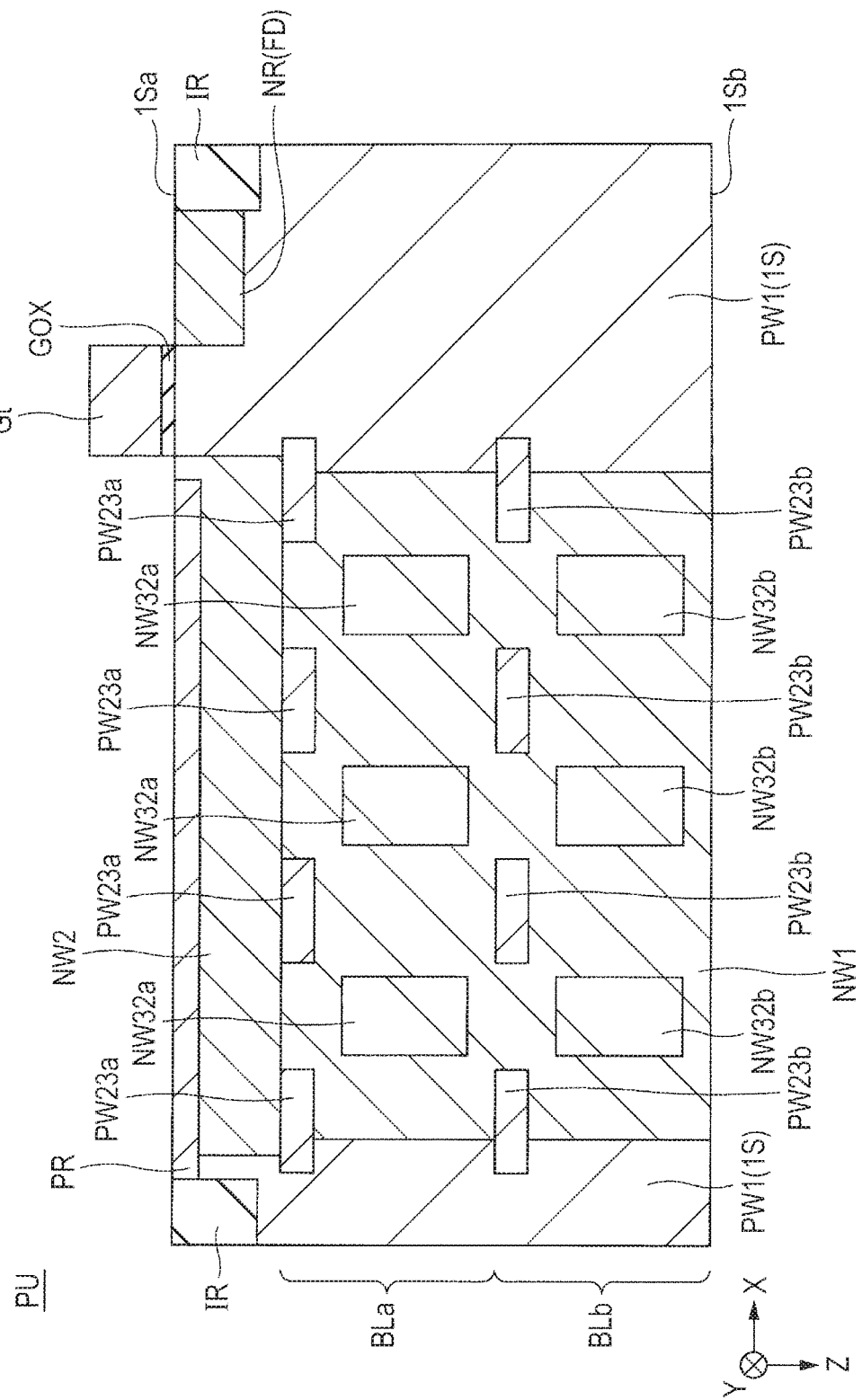
FIG. 25 is a cross sectional view showing a configuration of a semiconductor device of Modified Example 3

Modified Example 3 is Modified Example of Modified Example 2. FIG. 25 is a cross sectional view showing a configuration of a semiconductor device of Modified Example 3.

As shown in FIG. 25, a plurality of n type semiconductor regions NW32a and NW32b, and a plurality of p type semiconductor regions PW23a and PW23b are arranged in the n type semiconductor region NW1. The plurality of n type semiconductor regions NW32a and NW32b each correspond to the n type semiconductor region NW3 of FIG. 5. The plurality of p type semiconductor regions PW23a and PW23b each correspond to the p type semiconductor region PW2 of FIG. 5.

The block BLa situated on the main surface 1Sa side of the semiconductor substrate 1S includes a plurality of p type semiconductor regions PW23a and a plurality of n type semiconductor regions NW32a. The block BLb situated on the back surface 1Sb side includes a plurality of p type semiconductor regions PW23b and a plurality of n type semiconductor regions NW32b.

With such a configuration, it is possible to improve the charge transfer efficiency even when the n type semiconductor region NW1 is set wider and deeper.

Incidentally, in a method for manufacturing a semiconductor device of Modified Example 3, the plurality of p type semiconductor regions PW23a and the plurality of n type semiconductor regions NW32a included in the block BLa are formed by ion implantation from the main surface 1Sa side of the semiconductor substrate 1S. Then, the plurality of p type semiconductor regions PW23b and the plurality of n type semiconductor regions NW32b included in the block BLb can also be formed by ion implantation from the back surface 1Sb side of the semiconductor substrate 1S.

Up to this point, the invention completed by the present inventors was described by way of the embodiments. However, it is naturally understood that the present invention is not limited to the embodiments, and may be variously changed within the scope not departing from the gist thereof.

What is claimed is:

1. A semiconductor device, comprising:
a semiconductor substrate of a first conductivity type having a main surface, and a back surface facing to the main surface;
a gate electrode formed over the main surface via a gate insulation film, having a desirable width in a first direction, and extending in a second direction orthogonal to the first direction;
a first semiconductor region and a second semiconductor region having a second conductivity type different from the first conductivity type, and formed in the semiconductor substrate in such a manner as to interpose the gate electrode therebetween in the first direction;
a third semiconductor region of the first conductivity type situated between the second semiconductor region and the back surface, being in contact with the second semiconductor region, and extending in the first direction;
a fourth semiconductor region of the second conductivity type situated between the third semiconductor region and the back surface, being in contact with the third semiconductor region, extending in the first direction, and extending in a third direction pointing from the main surface toward the back surface; and
a fifth semiconductor region of the second conductivity type formed in the fourth semiconductor region,
wherein an impurity density of the fifth semiconductor region is lower than an impurity density of the fourth semiconductor region.

2. The semiconductor device according to claim 1, wherein an impurity density of the second semiconductor region is higher than the impurity density of the fourth semiconductor region.

3. The semiconductor device according to claim 1, wherein in the first direction, the fifth semiconductor region is arranged at L central part of the fourth semiconductor region, and
wherein in the third direction, the fifth semiconductor region is separated from the third semiconductor region.

4. The semiconductor device according to claim 1, further comprising a sixth semiconductor region of the first conductivity type in contact with the fourth semiconductor region, and surrounding the fourth semiconductor region in a plan view,
wherein an impurity density of the third semiconductor region is lower than an impurity density of the sixth semiconductor region.

5. The semiconductor device according to claim 1, further comprising a seventh semiconductor region of the first conductivity type situated between the main surface and the second semiconductor region.

6. The semiconductor device according to claim 1, wherein in the fourth semiconductor region, a plurality of ones of the fifth semiconductor region are arranged in the first direction.

7. The semiconductor device according to claim 1, wherein an impurity density of the second semiconductor region is $5 \times 10^{16}$ to $5 \times 10^{17}$ cm$^{-3}$,
wherein an impurity density of the third semiconductor region is $1 \times 10^{15}$ to $1 \times 10^{16}$ cm$^{-3}$,
wherein an impurity density of the fourth semiconductor region is $5 \times 10^{15}$ to $5 \times 10^{16}$ cm$^{-3}$, and
wherein an impurity density of the fifth semiconductor region is $1 \times 10^{14}$ to $1 \times 10^{15}$ cm$^{-3}$.

* * * * *